US010461388B2

(12) United States Patent
Kamgaing et al.

(10) Patent No.: US 10,461,388 B2
(45) Date of Patent: Oct. 29, 2019

(54) MILLIMETER WAVE FABRIC NETWORK OVER DIELECTRIC WAVEGUIDES

(71) Applicant: INTEL CORPORATION, Santa Clara, CA (US)

(72) Inventors: Telesphor Kamgaing, Chandler, AZ (US); Georgios C. Dogiamis, Chandler, AZ (US); Sasha N. Oster, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/394,990

(22) Filed: Dec. 30, 2016

(65) Prior Publication Data

US 2018/0191049 A1 Jul. 5, 2018

(51) Int. Cl.
H04B 1/40 (2015.01)
H01P 3/16 (2006.01)
(Continued)

(52) U.S. Cl.
CPC .............. H01P 3/165 (2013.01); H01P 3/122 (2013.01); H04B 1/40 (2013.01); H01P 3/127 (2013.01)

(58) Field of Classification Search
CPC .......... H01P 3/127; H01P 3/165; H03M 5/00; H03M 9/00; H04B 1/38; H04B 1/40; H04B 7/24; H04B 15/00; H04L 7/00; H04L 7/04; H04L 25/03; H04L 25/14; H04L 27/00; H04L 27/10; H04L 27/34
(Continued)

(56) References Cited

U.S. PATENT DOCUMENTS 5,363,464 A 11/1994 Way
5,545,924 A 8/1996 Contolatis et al.
(Continued)

FOREIGN PATENT DOCUMENTS

JP 2005-203884 A 7/2005
JP 2008-244857 A 10/2008
(Continued)

OTHER PUBLICATIONS

Unpublished U.S. Appl. No. 15/282,050, filed Sep. 30, 2016.
(Continued)

Primary Examiner — Shawkat M Ali
(74) Attorney, Agent, or Firm — Grossman, Tucker, Perreault & Pfleger, PLLC

(57) ABSTRACT

Radio frequency (RF) data transfer between components in rack mounted systems is facilitated through the use of dielectric waveguides and millimeter Wave (mm-Wave) transceivers. A signal generator provides one or more data signals to a serializer/deserializer (SERDES) which serializes a plurality of parallel data signals to produce a single, serialized, signal containing data from each of the input signals to the SERDES. A mm-Wave die upconverts the serialized signal to a mm-Wave signal and a mm-Wave launcher launches the signal into the dielectric waveguide. At the receiving end the process is reversed such that the mm-Wave signal is first downconverted and passed through a SERDES to provide the original one or more signals to a recipient signal generator. Some or all of the components may be formed directly in the semiconductor package.

29 Claims, 12 Drawing Sheets

(51) Int. Cl.
*H01P 3/12* (2006.01)
*H01P 3/127* (2006.01)

(58) Field of Classification Search
USPC .......... 341/55, 101; 375/219, 229, 236, 295, 375/316, 371; 455/39
See application file for complete search history.

(56) References Cited

U.S. PATENT DOCUMENTS

| | | | |
|---|---|---|---|
| 9,960,849 | B1 | 5/2018 | Dogiamis et al. |
| 2002/0186105 | A1 | 12/2002 | Shih et al. |
| 2003/0038690 | A1 | 2/2003 | Abe et al. |
| 2003/0197572 | A1 | 10/2003 | Ammar |
| 2004/0069984 | A1* | 4/2004 | Estes ...................... B82Y 10/00 257/25 |
| 2005/0012199 | A1 | 1/2005 | Rosenau et al. |
| 2005/0099424 | A1 | 5/2005 | Sano |
| 2008/0036558 | A1 | 2/2008 | Suarez-Gartner et al. |
| 2008/0136689 | A1* | 6/2008 | Gonzalez ............... H03K 5/135 341/101 |
| 2008/0160931 | A1 | 7/2008 | Rofougaran |
| 2009/0058571 | A1 | 3/2009 | Takemoto et al. |
| 2010/0052827 | A1 | 3/2010 | Schneider et al. |
| 2011/0018657 | A1 | 1/2011 | Cheng et al. |
| 2013/0082800 | A1 | 4/2013 | Rofougaran et al. |
| 2014/0097917 | A1 | 4/2014 | Shah et al. |
| 2014/0240187 | A1 | 8/2014 | Herbsommer et al. |
| 2014/0291835 | A1 | 10/2014 | Demin et al. |
| 2014/0355663 | A1* | 12/2014 | Kizer ................ H04L 25/03885 375/236 |
| 2014/0368301 | A1 | 12/2014 | Herbsommer et al. |
| 2015/0029069 | A1 | 1/2015 | Roemer et al. |
| 2015/0048471 | A1 | 2/2015 | Hasch et al. |
| 2015/0109739 | A1 | 4/2015 | Shapiro et al. |
| 2015/0364830 | A1 | 12/2015 | Tong et al. |
| 2016/0043455 | A1 | 2/2016 | Seler et al. |
| 2016/0064795 | A1 | 3/2016 | Chang et al. |
| 2016/0142155 | A1* | 5/2016 | Kim ..................... H04B 10/803 398/141 |
| 2017/0047312 | A1* | 2/2017 | Budd ................... G02B 6/4204 |
| 2018/0052281 | A1* | 2/2018 | Kuo ........................ H04B 1/38 |
| 2018/0097268 | A1 | 4/2018 | Oster et al. |
| 2018/0183561 | A1 | 6/2018 | Dogiamis et al. |

FOREIGN PATENT DOCUMENTS

| | | |
|---|---|---|
| WO | 2012-040376 A1 | 3/2012 |
| WO | 2015-157548 A1 | 10/2015 |
| WO | 2018-057006 A1 | 3/2018 |
| WO | 2018-063238 A1 | 4/2018 |
| WO | 2018-063341 A1 | 4/2018 |
| WO | 2018-063342 A1 | 4/2018 |
| WO | 2018-063362 A1 | 4/2018 |
| WO | 2018-063388 A1 | 4/2018 |
| WO | 2018125479 A1 | 7/2018 |

OTHER PUBLICATIONS

Unpublished PCT Application No. PCT/US2016/054888, filed Sep. 30, 2016.
Unpublished PCT Application No. PCT/US2016/054977, filed Sep. 30, 2016.
Unpublished PCT Application No. PCT/US2016/054837, filed Sep. 30, 2016.
Unpublished PCT Application No. PCT/US2016/054832, filed Sep. 30, 2016.
Unpublished PCT Application No. PCT/US2016/054417, filed Sep. 29, 2016.
Unpublished PCT Application No. PCT/US2016/053491, filed Sep. 23, 2016.
Unpublished U.S. Appl. No. 15/388,383, filed Dec. 22, 2016.
Unpublished U.S. Appl. No. 15/388,204, filed Dec. 22, 2016.
International Search Report and Written Opinion issued in PCT Application No. PCT/US2017/063600, dated Mar. 8, 2018, 14 pages.
International Search Report and Written Opinion issued in PCT Application No. PCT/US2016/054888, dated Apr. 25, 2017, 11 pages.
International Search Report and Written Opinion issued in PCT Application No. PCT/US2016/054977, dated Apr. 25, 2017, 16 pages.
International Search Report and Written Opinion issued in PCT Application No. PCT/US2016/054832, dated Apr. 25, 2017, 10 pages.
International Search Report and Written Opinion issued in PCT Application No. PCT/US2016/054837, dated Apr. 25, 2017, 14 pages.
International Search Report and Written Opinion issued in PCT Application No. PCT/US2016/053491, dated Apr. 25, 2017, 10 pages.
International Search Report and Written Opinion issued in PCT Application No. PCT/US2016/054417, dated Jun. 20, 2017, 9 pages.
International Preliminary Report on Patentability issued in PCT Application No. PCT/US2016/053491, dated Mar. 26, 2019, 8 pages.
International Preliminary Report on Patentability issued in PCT Application No. PCT/US2016/054417, dated Apr. 2, 2019, 7 pages.
International Preliminary Report on Patentability issued in PCT Application No. PCT/US2017/063600, dated Jul. 11, 2019, 11 pages.

* cited by examiner

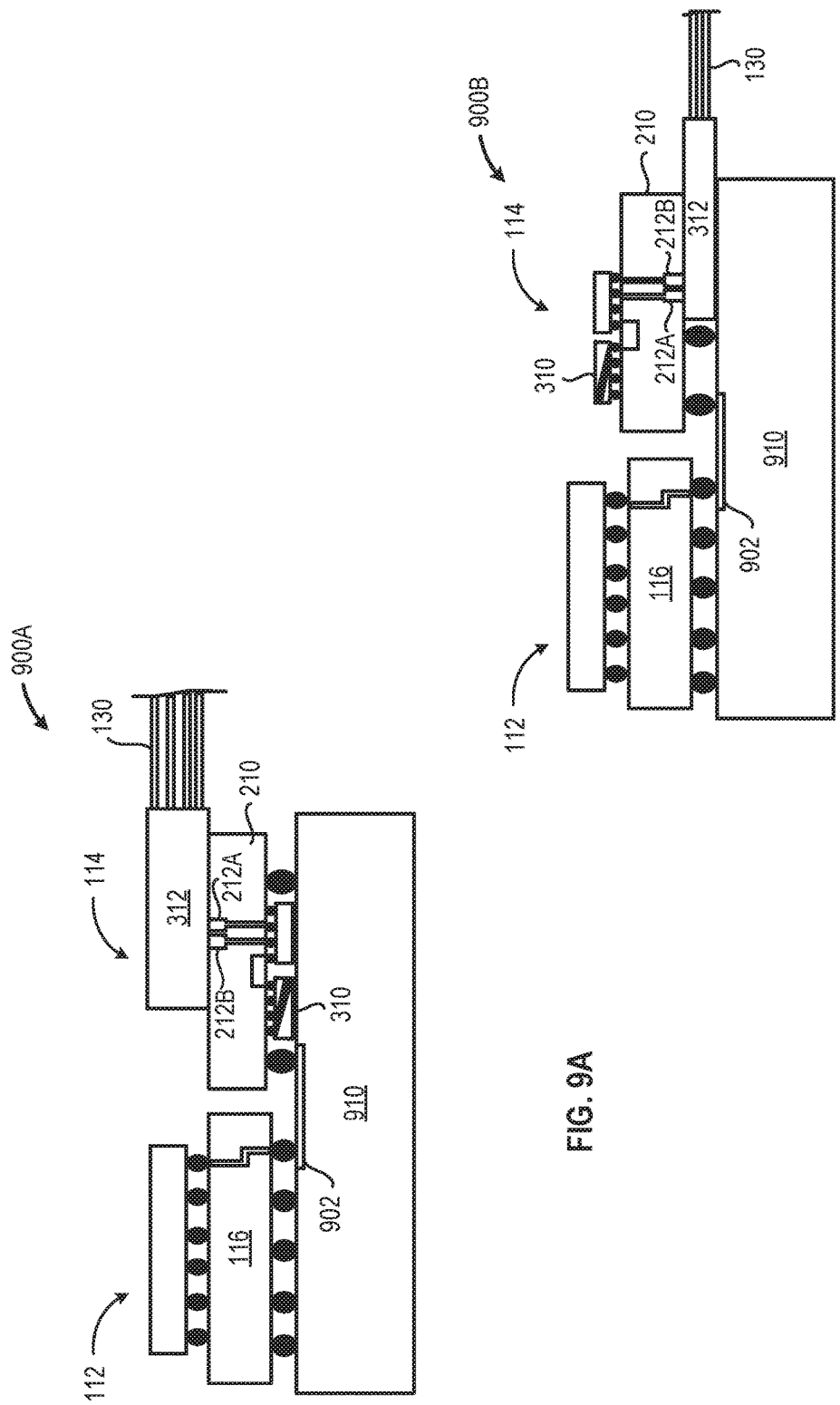

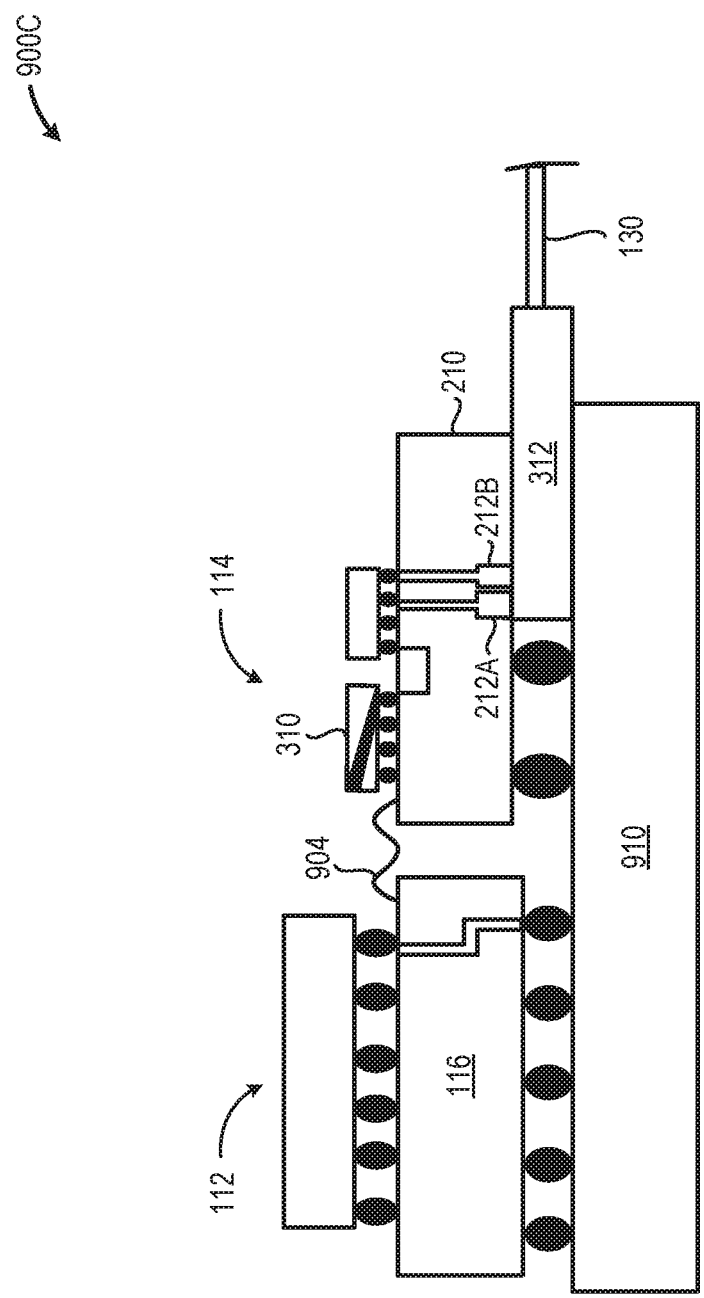

US 10,461,388 B2

MILLIMETER WAVE FABRIC NETWORK OVER DIELECTRIC WAVEGUIDES

TECHNICAL FIELD

The present disclosure relates to systems and methods for interconnection of semiconductor packages using dielectric waveguides.

BACKGROUND

As more devices become interconnected and users consume more data, the demand placed on servers accessed by users has increased commensurately and shows no signs of letting up in the near future. Among others, these demands include increased data transfer rates, switching architectures that require longer interconnects, and extremely cost and power competitive solutions.

There are many interconnects within server and high performance computing (HPC) platforms today. These interconnects include within blade interconnects, within rack interconnects, and rack-to-rack or rack-to-switch interconnects. In today's architectures, short interconnects (for example, within rack interconnects and some rack-to-rack) interconnects are achieved with electrical cables—such as Ethernet cables, co-axial cables, or twin-axial cables, depending on the required data rate. For longer distances, optical solutions are employed due to the very long reach and high bandwidth enabled by fiber optic solutions. However, as new architectures emerge, such as 100 Gigabit Ethernet, traditional electrical connections are becoming increasingly expensive and power hungry to support the required data rates. For example, to extend the reach of a cable or the given bandwidth on a cable, higher quality cables may need to be used or advanced equalization, modulation, and/or data correction techniques employed which add power and latency to the system. For some distances and data rates required in proposed architectures, there is no viable electrical solution today. Optical transmission over fiber is capable of supporting the required data rates and distances, but at a severe power and cost penalty, especially for short to medium distances, such as a few meters.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

FIG. 9A is a cross-sectional elevation depicting an illustrative system that includes a semiconductor package having a logic circuit coupled to a RF-signal generator, such as a mm-Wave die, via a substrate trace, two RF-signal launchers, such as two mm-Wave launchers, a bottom-mounted SERDES, a top-mounted waveguide connector disposed proximate the RF-signal launchers, and a plurality of waveguides that are operably, physically, and communicably coupled to a substrate, in accordance with at least one embodiment described herein;

FIG. 9B is a cross-sectional elevation depicting another illustrative system that includes a semiconductor package having a logic circuit coupled to a RF-signal generator, such as a mm-Wave die, via a substrate trace, two RF-signal launchers, such as two mm-Wave launchers, a top-mounted SERDES, a bottom-mounted waveguide connector disposed proximate the RF-signal launchers, and a plurality of waveguides that are operably, physically, and communicably coupled to a substrate, in accordance with at least one embodiment described herein;

FIG. 9C is a cross-sectional elevation depicting yet another illustrative system that includes a semiconductor package having a logic circuit coupled to a RF-signal generator, such as a mm-Wave, die via a flex connector, two RF-signal launchers, such as two mm-Wave launchers, a top-mounted SERDES, a bottom-mounted waveguide connector disposed proximate the RF-signal launchers, and a plurality of waveguides that are operably, physically, and communicably coupled to a substrate, in accordance with at least one embodiment described herein;

Figure 1:
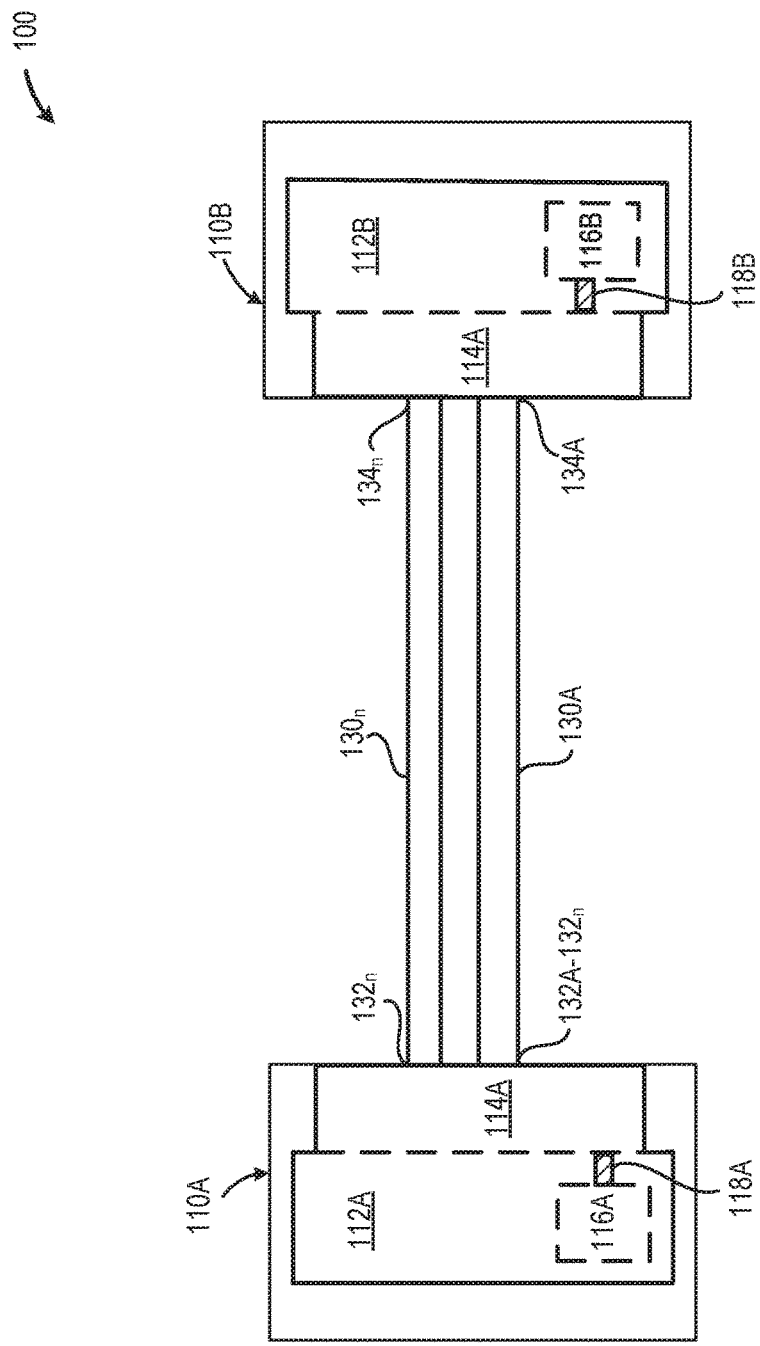
FIG. 1 is a schematic depicting an illustrative system in which two semiconductor packages, each including at least one logic circuit, that are communicably coupled via a plurality of dielectric waveguides, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

As data transfer speeds continue to increase, cost efficient and power competitive solutions are needed for communication between blades installed in a rack and between nearby racks. Such distances typically range from less than 1 meter to about 10 meters or even further. The systems and methods disclosed herein use millimeter-wave transceivers paired with waveguides to communicate data between blades and/or racks at transfer rates in excess of 25 gigabits per second (Gbps). The millimeter wave signal launchers used to transfer data may be formed and/or positioned in, on, or about the semiconductor package. A significant challenge exists in aligning the millimeter-wave signal launcher with the waveguide member to maximize the energy transfer from the millimeter-wave signal launcher to the waveguide member. Further difficulties may arise as a result of the wide variety of available waveguide members. Metallic and metal coated waveguide members are available and may include open or partially open cross-sections such as rectangular, circular, polygonal, oval, and other shapes. Such waveguide members may include hollow members, members having a conductive and/or non-conductive internal structure, and hollow members partially or completely filled with a dielectric medium. Furthermore, space requirements of modern, rack-based, server systems often preclude "high-rise" 90° waveguide transitions from the semiconductor package to a waveguide raceway positioned along the side or rear of the rack-mounted server.

A principal goal in effecting cost-effective and efficient radio frequency (RF) and millimeter wave communication between semiconductor packages is coupling a waveguide to a semiconductor package such that the energy transferred between the emitter assembly and the waveguide is maximized, or conversely that energy loss between the emitter assembly and the waveguide is minimized. Such coupling is complicated by the shape of the waveguide member, the relatively small dimensions associated with the waveguide member (e.g., 5 millimeters or less), the relatively tight tolerances required to maximize energy transfer (e.g., 50 micrometers or less), and a millimeter-wave launcher that is potentially hidden beneath the surface of the semiconductor package. Additionally, packaging such that the semiconductor package, the emitter assembly and the waveguide all fit within the tight confines typically found in rack mount environments. The systems and methods described herein provide new, novel, and innovative systems and methods for providing a radio frequency or mm-Wave frequency communication system between semiconductor packages positioned in the same rack or in nearby racks. Such systems and methods beneficially leverage the relatively high energy efficiency and relatively low losses associated with waveguide transmission systems.

The systems and methods disclosed herein are adaptable to a wide variety of operational layouts including individual millimeter-wave antennas, millimeter-wave antennas arranged in regular arrays or patterns, and/or millimeter-wave antennas arranged in irregular arrays or patterns. In some instances, a plurality of waveguide members may be physically coupled or grouped in a pattern or array by a connector member. In such instances, one or more complimentary connector features may be formed and/or deposited along an edge of the semiconductor package such that the connector member properly positions each waveguide member proximate a respective side-radiating waveguide launcher when the connector member engages the complimentary connector feature disposed on the edge of the semiconductor package.

A radio frequency communication system between semiconductor packages is provided. The system may include an RF waveguide having a first end and a second end, a first semiconductor package that includes a first RF transceiver communicably coupled to the first end of the RF waveguide, and a second semiconductor package that includes a second RF transceiver communicably coupled to the second end of the RF waveguide to provide a bidirectional RF communication pathway between the first semiconductor package and the second semiconductor package, the second semiconductor package disposed remote from the first semiconductor package.

A method of communicating at least one radio frequency (RF) signal between a first semiconductor package and a second semiconductor package via an RF waveguide is provided. The method may include generating, by the first semiconductor package, a high frequency RF signal using a plurality of parallel, low frequency, signals, each of the plurality of low frequency signals including data representative of at least one channel; and launching the high frequency RF signal into a first end of an RF waveguide via a first RF transceiver communicably coupled to the first semiconductor package.

A rack-mountable semiconductor package is provided. The rack-mountable semiconductor package may be directly communicably coupleable to a radio frequency (RF) waveguide and may include a plurality of low frequency signal generators disposed in, on, or about the rack-mountable semiconductor package; a serializer/deserializer (SERDES) disposed communicably coupled to each of the plurality of low frequency signal generators to generate a low frequency serial output that includes a data contribution from each of at least some of the plurality of low frequency signal generators; a mm-wave die communicably coupled to the SERDES, the mm-Wave die to receive the low frequency serial output and provide a high frequency serial output; and a mm-Wave launcher communicably coupled to the mm-Wave die and communicably coupleable to an RF waveguide, the mm-Wave launcher to receive the high frequency serial output signal and launch the high frequency serial output signal into the RF waveguide.

A method of launching at least one radio frequency (RF) signal into an RF waveguide is provided. The method may include generating, by a rack-mountable semiconductor package, a plurality of low frequency signals; serializing, using a serializer/deserializer (SERDES) communicably coupled to the semiconductor package, the plurality of low frequency signals to provide a low frequency serial output that includes a data contribution from each of at least some of the plurality of low frequency signals; shifting the low frequency serial output signal to a high frequency serial output signal using a mm-Wave die communicably coupled to the SERDES; and launching the high frequency serial output signal into the RF waveguide.

A system for launching at least one radio frequency (RF) signal into an RF waveguide is provided. The system may include a means for generating a plurality of low frequency signals; a means for serializing the plurality of low frequency signals to provide a low frequency serial output that includes a data contribution from each of at least some of the plurality of low frequency signals; a means for shifting the low frequency serial output signal to a high frequency serial output signal; and a means for launching the high frequency serial output signal into the RF waveguide.

A system for communicating at least one radio frequency (RF) signal between a first semiconductor package and a second semiconductor package via an RF waveguide is provided. The system may include a means for generating a high frequency RF signal using a plurality of parallel, low frequency, signals, each of the plurality of low frequency signals including data representative of at least one channel; and a means for launching the high frequency RF signal into a first end of an RF waveguide via a first RF transceiver communicably coupled to the first semiconductor package.

As used herein the terms "top" and "bottom" and similar terms designate relative and not absolute directions. Thus, a component described as a "top component" of a device and a component described as a "bottom component" of a device may, when the device is inverted, become the "bottom component" and the "top component," respectively.

As used herein, the terms "radio frequency" and "RF" refer to all or a portion of the electromagnetic spectrum that exists between frequencies of about 3 kilohertz (kHz) to about 1 Terahertz (THz). As used herein, the term "mm-Wave" refers to all or a portion of the RF electromagnetic spectrum that exists between frequencies of about 30 GHz to about 300 GHz. Thus, mm-Wave frequencies correspond to mm-Wave signals having wavelengths of from about 1 millimeter to about 10 millimeters.

As used herein the term "modular side radiating waveguide launcher" refers to any launcher device and/or system capable of emitting, propagating, or otherwise communicating an RF signal in a direction that is parallel to the plane of the semiconductor package containing the waveguide launcher. Such modular side radiating waveguide launchers may emit, propagate, or otherwise communicate the RF signal from a side, edge, or similar lateral portion of the semiconductor package containing the waveguide launcher. In some implementations, such modular side radiating waveguide launchers may emit, propagate, or otherwise communicate the RF signal along a plane that is substantially coplanar (i.e., within +/−5°) with the plane of the semiconductor package containing the waveguide launcher. Such modular side radiating waveguide launchers may be at least partially embedded in the semiconductor package. Such modular side radiating waveguide launchers may extend at least partially from a side or lateral surface of the semiconductor package.

FIG. 1 depicts an illustrative system 100 in which two semiconductor packages 110A and 110B (collectively, "semiconductor packages 110") each including at least one logic circuit 116A and 116B, respectively (collectively, "logic circuit 116") communicably coupled via a plurality of dielectric waveguides 130A-130n (collectively, "waveguides 130"), in accordance with at least one embodiment described herein. In embodiments, the semiconductor packages 110A and 110B may include a respective radio frequency (RF) signal generator 112A and 112B (collectively, "RF-signal generators 112") and a respective radio frequency (RF) transceiver 114A and 114B (collectively, "RF-signal transceivers 114") that are communicably and conductively coupled via one or more conductors 118. The semiconductor packages 110 bidirectionally communicate information and/or data generated by the logic circuits 116 via radio frequency (RF) signals transmitted along waveguides 130. In at least some implementations, the RF signals transmitted along the waveguides 130 may include millimeter wave ("mm-Wave") signals having a frequency of from about 30 GHz to about 300 GHz, for example mm-Wave signals in a frequency band of from about 90 GHz to about 120 GHz.

In at least some implementations, the semiconductor packages 110 may be operably and/or communicably coupled to rack-mount devices such as blade servers, rack-mount communication interfaces, rack-mounted storage devices, and similar. In some implementations, the waveguides 130 may communicably couple semiconductor packages 110 disposed on different devices within the same rack enclosure. In some implementations, the waveguides 130 may communicably couple semiconductor packages 110 disposed on different devices in different rack mount enclosures. Where the waveguides 130 communicably couple semiconductor packages 110 in different racks, the racks may be separated by a distance of: about 1 meter (m) or less; about 3 m or less; about 5 m or less; about 10 m or less; or about 25 m or less. In some implementations, the semiconductor packages 110 may be disposed in different locations on the same rack-mount device.

The logic circuit 116 may include any number and/or combination of systems and/or devices capable of generating information and/or data in the form of an intermediate frequency signal. Example logic circuits 116 may include, but are not limited to: central processing units (CPUs), memory switches, fabric switches, or combinations thereof. In some implementations, the logic circuit 116 may generate digital information and/or data at one or more defined data generation rates. In some implementations, the logic circuit 116 may generate one or more signals having an information and/or data rate of: about 1 MHz or less; about 10 MHz or less; about 100 MHz or less; about 1 GHz or less; about 5 GHz or less; about 10 GHz or less; about 30 GHz or less; or about 50 GHz or less. In some implementations, the logic circuit 116 may include one or more processors, microprocessor, controllers, signal processors, graphics processors, co-processors, or the like. In some implementations, the logic circuit 116 may include one or more communications interfaces communicably coupled to one or more processors, microprocessor, controllers, signal processors, graphics processors, co-processors, or the like. In implementations, the logic circuit 116 may include one or more transmitters, one or more receivers, or one or more transceivers. In such implementations, a first logic circuit 116A may bidirectionally exchange information and/or data via waveguides 130 with one or more second logic circuits 116B-116n.

In some implementations, the information and/or data generated by the logic circuit 116 may be modulated onto one or more high frequency carrier signals using one or more devices, components, and/or systems. In implementations, the high frequency signal may include one or more radio frequency (RF) signals produced or otherwise generated using one or more signal generators 112. In some implementations, the high frequency signal may include one or more mm-Wave signals in a frequency band of from about 30 GHz to about 300 GHz. In some implementations, the high frequency signal may include a mm-Wave signal in a frequency band of from about 90 GHz to about 120 GHz that is introduced by a first semiconductor package 110A to a first end 132 of a waveguide 130 and is received at one or more destination semiconductor packages 110B at a second end 134 of waveguide 130.

The waveguides 130 that communicably couple the semiconductor packages 110 may have any shape, size, number, or configuration. In some implementations, each of the waveguides 130 may carry a single signal that propagates along the waveguide 130 in a single direction. In some implementations, each of the waveguides 130 may carry multiple signals propagating along the waveguide 130 in the same or opposing directions. In some implementations, each of the waveguides 130 may carry a plurality of different mm-Wave signals having differing polarizations (e.g., one vertically polarized mm-Wave signal and one horizontally polarized mm-Wave signal). In some implementations, the waveguides 130 may terminate and/or communicably couple to the semiconductor package 110 in a location proximate a structure used to transmit and/or receive the RF signal traveling along or propagating through the waveguide 130.

The waveguides 130 may be of similar size, shape, and/or cross-section or may be of different size, shape, and/or cross-section. In some implementations, some or all of the waveguides 130 are hollow conductive members having a uniform cross-sectional profile (e.g., hollow square, hollow rectangle, hollow oval, and similar). In some implementations, some or all of the waveguides 130 are dielectric filled conductive members having a uniform cross-sectional profile (e.g., dielectric filled square, dielectric filled rectangle, dielectric filled oval, and similar). Generally, the size and configuration of the waveguide 130 may be based in whole or in part on the frequency and/or polarization of the RF signals propagated through, by, or along the waveguide 130.

Figure 2:
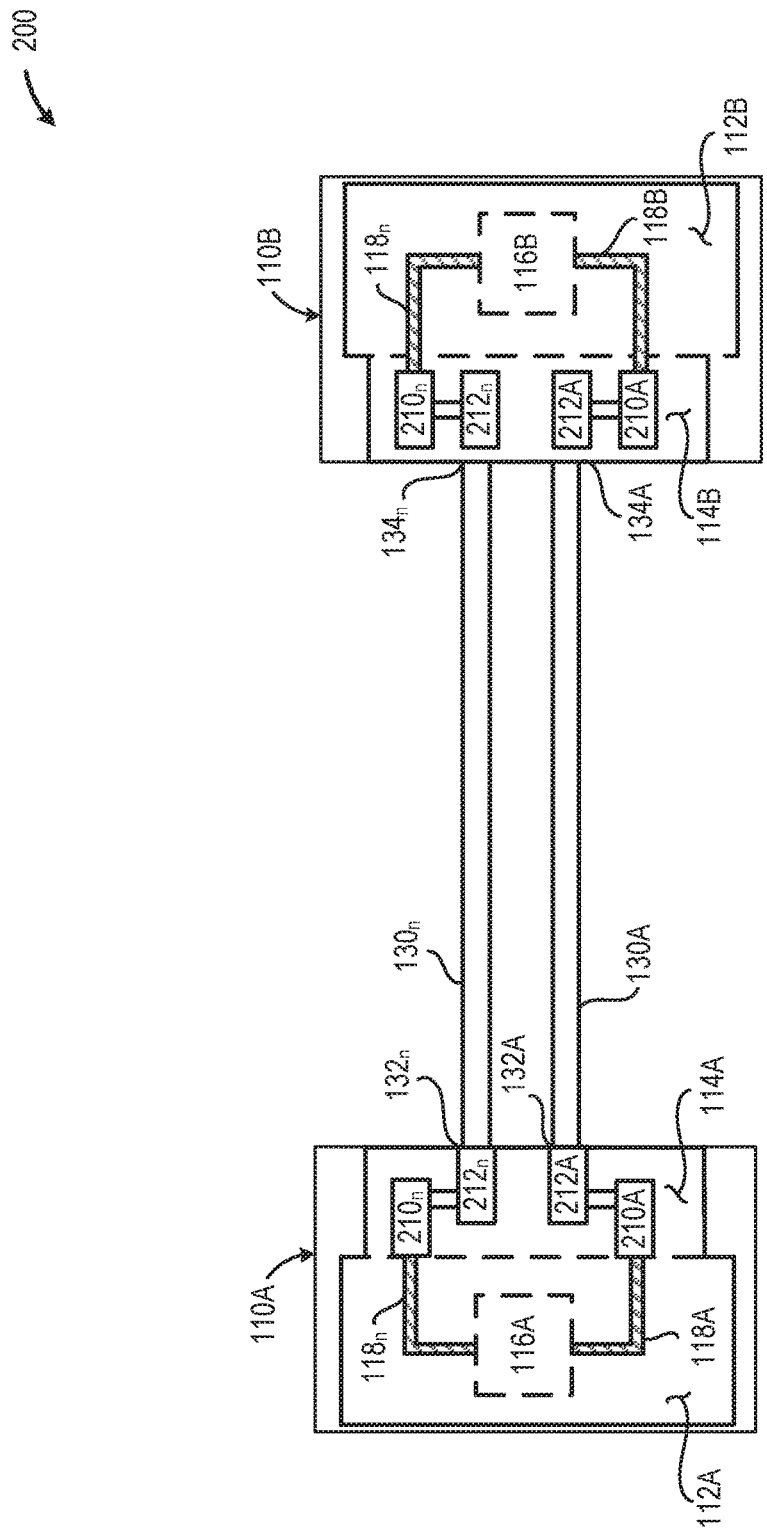
FIG. 2 is a schematic depicting an illustrative system in which two semiconductor packages each including at least one signal generator, a plurality of RF-signal generators communicably coupled to a respective plurality of RF-signal launchers that are communicably coupled to the plurality of dielectric waveguides, in accordance with at least one embodiment described herein.

FIG. 2 depicts an illustrative system 200 in which two semiconductor packages 110A and 110B each including a respective logic circuit 116A and 116B, a plurality of RF-signal generators 210A-210n (collectively "RF-signal generators 210") communicably coupled to a respective plurality of RF-signal launchers 212A-212n (collectively "RF-signal launchers 212") that are communicably coupled to the plurality of dielectric waveguides 130A-130n, in accordance with at least one embodiment described herein. As depicted in FIG. 2, the information and/or data generated by the logic circuit 116 is transmitted via one or more electrically conductive members 118A-118n that conductively couple the logic circuit 116 to the RF-signal generators 210. In embodiments, the RF-signal generators 210 may modulate or otherwise encode one the information and/or data generated by the logic circuit 116 on one or more RF-signals. In some implementations, some or all of the RF-signal generators 210 may include one or more mm-Wave dies that modulate or otherwise encode one the information and/or data received from the logic circuit 116 on a mm-Wave carrier signal. An RF-signal launcher 212 receives the RF signal from the RF-signal generator 210 and launches the RF signal into the waveguide 130.

In a first (e.g., transmission) operating mode, the RF-signal generators 210 include any number and/or combination of systems and/or devices capable of receiving information and/or data from the logic circuit 116 and upconverting the intermediate frequency signal(s) received from the logic circuit 116 to generate one or more higher frequency RF signals (e.g., mm-Wave signals) that include a representation of at least a portion of the information and/or data received from the logic circuit 116. In addition to upconverting the intermediate frequency signal(s) received from the logic circuit 116, the RF-signal generators 210 may also perform one or more additional functions including, but not limited to: equalization, dispersion compensation, filtering, or combinations thereof.

In a second (e.g., reception) operating mode, the RF-signal generators 210 include any number and/or combination of systems and/or devices capable of receiving higher frequency RF signals (e.g., mm-Wave signals) from the waveguide 130 via the RF-signal launcher 212. In the second operating mode, the RF-signal generators 210 may downconvert the higher frequency RF signals to provide an intermediate frequency signal to the logic circuit 116 that includes the information and/or data carried by the received RF signal. In embodiments, the RF-signal generators 210 may include dedicated transmitter circuitry, dedicated receiver circuitry, and/or dedicated transceiver circuitry.

In some implementations, the RF-signal generators 210 may be disposed partially or completely within the high-frequency portion of the semiconductor package 110. In some implementations, all or a portion of the RF-signal generators 210 may be integral with the logic circuit 116. In some implementations, all or a portion of the RF-signal generators 210 may be disposed at a location within the semiconductor package 110 that is remote from the logic circuit 116.

The RF-signal launchers 212 may include any number and/or combination of systems and/or devices capable of receiving the RF signal from the RF-signal generator 210 and launching the RF signal into a communicably coupled waveguide 130. In some implementations, the RF-signal launchers 212 may include any number and/or combination of systems and/or devices capable of receiving RF signals from the communicably coupled waveguide 130 and transmitting the received RF signal to the RF-signal generator 210. In some implementations, the RF-signal launcher 212 may include a number of components capable of forming a launching system. Such a launching system may include, for example, a grounded antenna structure formed in, on, or about the substrate of the semiconductor package 110, in such an arrangement, the RF-signal launcher 212 may include one or more conductive members that receive the RF signal from the RF-signal generator 210 and are disposed within an interior space defined by the grounded antenna structure.

For example, the grounded antenna structure may be formed using a plurality of grounded vias passing partially or completely through the substrate of the semiconductor package 110 and the RF-signal launcher 212 may include a via disposed within an interior space defined by the plurality of antenna vias that passes partially or completely through the substrate of the semiconductor package 110 and which is conductively coupled to the RF-signal generator 210. In another example, the grounded antenna structure may include a grounded edge mounted structure on the substrate of the semiconductor package 110 and the RF-signal launcher 212 may include a via that passes partially or completely through the substrate of the semiconductor package 110, is disposed within an interior space defined by the plurality of antenna vias, and is conductively coupled to the RF-signal generator 210. In yet another example, the grounded antenna structure may be formed partially or completely within the substrate of the semiconductor package 110 and the RF-signal launcher 212 may include a via that passes partially or completely through the substrate of the semiconductor package 110, is disposed within an interior space defined by the plurality of antenna vias, and is conductively coupled to the RF-signal generator 210.

Figure 3:
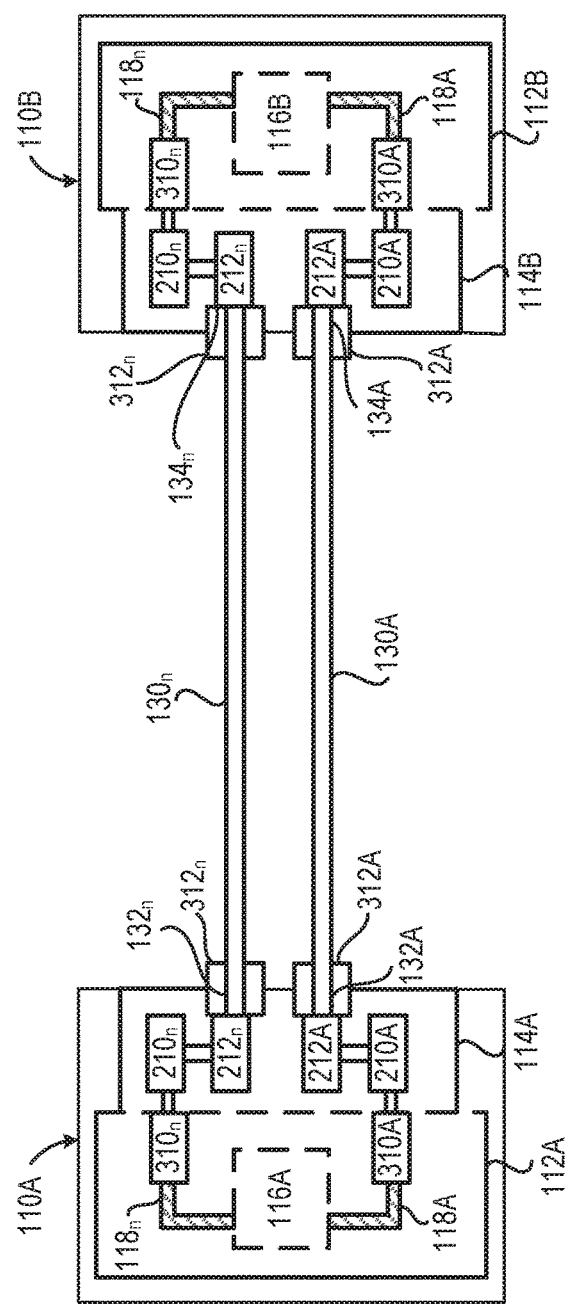
FIG. 3 is a schematic depicting an illustrative system that includes a plurality of semiconductor packages each of which includes at least one logic circuit communicably coupled to each of a plurality of serializer/deserializers (SERDES) and a plurality of attachment features that physically and operably couple some or all of the waveguides to the semiconductor packages, in accordance with at least one embodiment described herein.

FIG. 3 depicts an illustrative system 300 that includes a plurality of semiconductor packages 110A, 110B each of which includes a respective logic circuit 116A, 116B communicably coupled to each of a plurality of serializer/deserializers 310A-310n (collectively, "SERDES 310") and a plurality of attachment features 312A-312n (collectively, "attachment features 312") that physically and operably couple some or all of the waveguides 130A-130n to the semiconductor packages 110, in accordance with at least one embodiment described herein. As depicted in FIG. 3, when in a first mode (e.g., a "transmission" mode or similar) the logic circuit 116 provides a plurality of parallel signals, each including the same or different information and/or data, to the SERDES 310. The SERDES 310 serializes the information and/or data and provides a serialized output signal to the RF-signal generator 210. As depicted in FIG. 3, when in a second mode (e.g., a "receive" mode or similar) an RF signal from waveguide 130 may be received at the RF-signal generator 210. The RF-signal generator 210 may shift, filter, or otherwise demodulate the received RF signal to provide a serialized signal to the SERDES 310. The SERDES 310 deserializes the information and/or data prior to communicating the information and/or data as a plurality of parallel signals that include the same or different information and/or data to the logic circuit 116.

The SERDES 310 includes any number and/or combination of devices and/or systems capable of receiving a plurality of parallel signals from the logic circuit 116 and outputting a single serialized signal that includes information and/or data representative of the received plurality of parallel signals. In embodiments, the SERDES 310 may include a half-duplex device able to convert a plurality of parallel input signals to a single serialized signal but unable to convert a single serialized signal to a plurality of parallel signals. In other embodiments, the SERDES may include a full duplex device able to both convert a plurality of parallel input signals to a single serialized signal in a first direction AND convert a single serialized signal to a plurality of parallel signals in a second direction. The SERDES 310 may also include any number and/or combination of devices and/or system capable of receiving a serialized signal from the RF-signal generator 210 and outputting to the logic circuit 116 a plurality of parallel signals that include information and/or data received via an RF signal propagated along the waveguide 130.

As depicted in FIG. 3, some or all of the semiconductor packages 110 may include one or more waveguide attachment features 312 disposed in, on, or about at least a portion of the substrate on which the respective semiconductor package 110 is formed or otherwise assembled. The waveguide attachment features 312 physically couple the waveguide 130 to the substrate, and thus to the semiconductor package 110. As depicted in FIG. 3, a first plurality of waveguide attachment features 312A-312n physically and conductively couples respective first ends 132A-132n of waveguides 130 to the substrate of semiconductor package 110A and a second plurality of waveguide attachment features 312A-312n physically and conductively couples respective second ends 134A-134n of waveguides 130 to the substrate of semiconductor package 110B. In some implementations, the waveguide attachment features 312 permit the detachable attachment of the waveguide 130 to the substrate of the semiconductor package 110.

Example waveguide attachment features 312 permitting the detachable attachment of the waveguide 130 to the substrate of the semiconductor package 110 include, but are not limited to: one or more mechanical latches disposed directly on the waveguide 130 and/or the substrate of the semiconductor package 110; one or more mechanical latches disposed on a frame about the waveguide 130 and/or the substrate of the semiconductor package 110; or a partial or complete aperture formed in the waveguide attachment features 312 that permits the friction-fit engagement of the waveguide 130 with the waveguide attachment features 312. In some implementations, the waveguide attachment features 312 permit the permanent or non-detachable attachment of the waveguide 130 to the substrate of the semiconductor package 110. Example waveguide attachment features 312 permitting the permanent attachment of the waveguide 130 to the substrate of the semiconductor package 110 include, but are not limited to: one or more surface features disposed on or about all or a portion of the waveguide 130 that engage complimentary features disposed on or about all or a portion of the waveguide attachment features 312.

Figure 4:
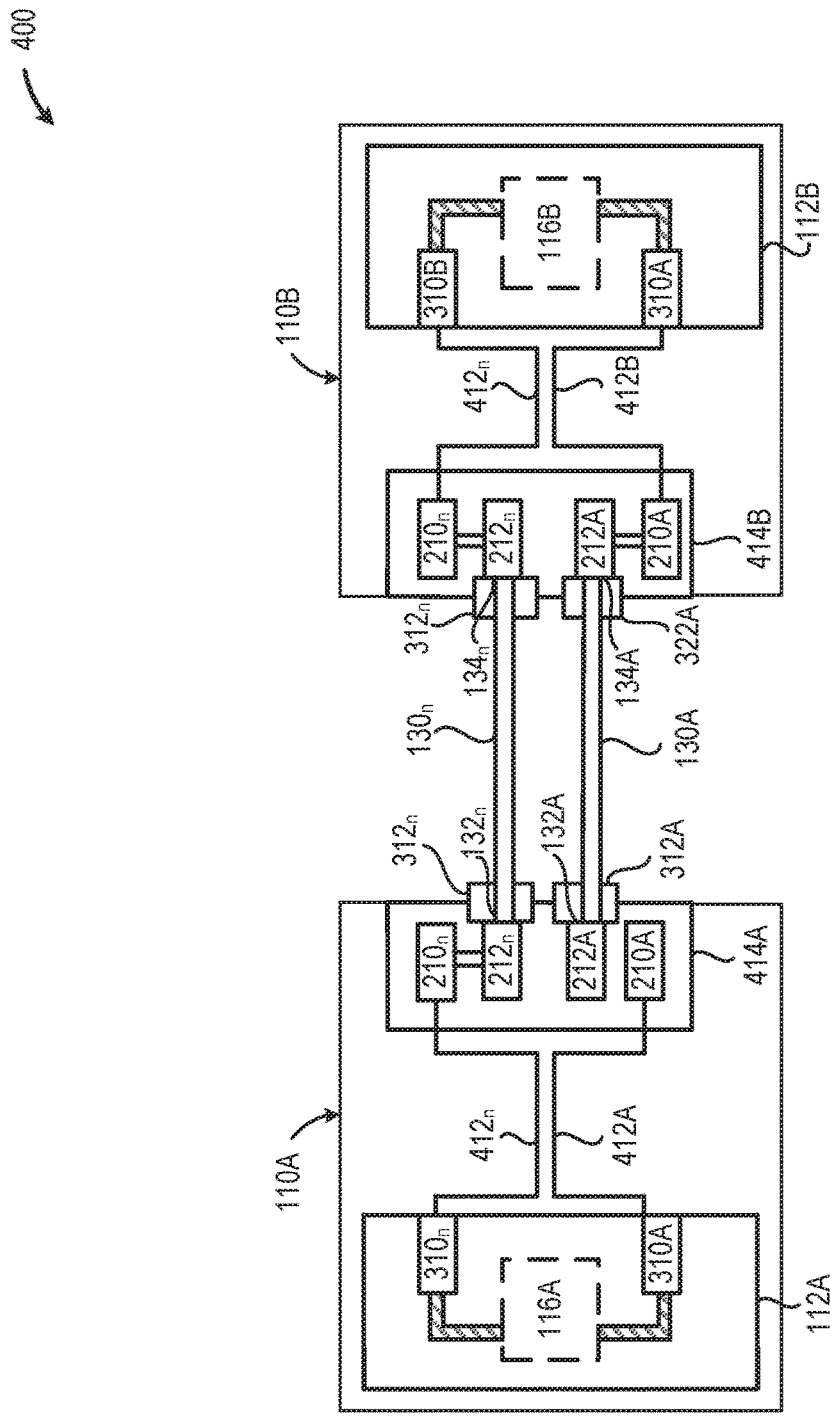
FIG. 4 is a schematic depicting an illustrative system that includes a plurality of semiconductor packages, each including a remote high frequency portion that includes the RF-signal generator and RF-signal launcher that is physically separated from and communicably coupled via one or more conductors to the low frequency portion that includes the logic circuit and SERDES, in accordance with at least one embodiment described herein.

FIG. 4 depicts an illustrative system 400 that includes a plurality of semiconductor packages 110A, 110B, each including a respective remote high frequency portion 414 that includes the RF-signal generator 210 and RF-signal launcher 212 physically separated from and communicably coupled via one or more conductors 412 to the respective signal generator 112A, 112B that includes the logic circuit 116A, 116B and SERDES 310A, 310B, in accordance with at least one embodiment described herein. As depicted in FIG. 4, when in a first mode (e.g., a "transmission" mode or similar) the logic circuit 116 provides a plurality of parallel signals, each including the same or different information and/or data, to the SERDES 310. The SERDES 310 serializes the information and/or data and provides a serialized output signal via one or more conductors 412 to the RF-signal generator 210. As depicted in FIG. 4, when in a second mode (e.g., a "receive" mode or similar) an RF signal from waveguide 130 may be received at the RF-signal generator 210. Within the high frequency portion 414, the RF-signal generator 210 may shift, filter, or otherwise demodulate the received RF signal. The RF-signal generator 210 then communicates the serialized signal to the SERDES 310 via one or more conductors 412. The SERDES 310 deserializes the information and/or data prior to communicating the information and/or data as a plurality of parallel signals that include the same or different information and/or data to the logic circuit 116.

In some implementations, the high frequency portion 414 and the signal generator 112 of some or all of the semiconductor packages 110 may be disposed on a common substrate. For example, the high frequency portion 414 and the signal generator 112 may be physically disposed on the same blade or rack mounted device. In such implementations, the one or more conductors 412 may include traces or similar conductive structures disposed partially or completely in, on, or about the substrate. In some implementations, the high frequency portions 414A-414n of a number of semiconductor packages 110 may be disposed in a first location within a rack or similar enclosure and the respective signal generator portions 112A-112n may be disposed in a second location within the same or a different rack (e.g., on a different blade or in a different rack altogether). In such implementations, one or more conductors, such as one or more wires, busses, or similar structures may communicably couple the signal generator 112 of each semiconductor package 110 to a respective low frequency portion 414.

Figure 5:
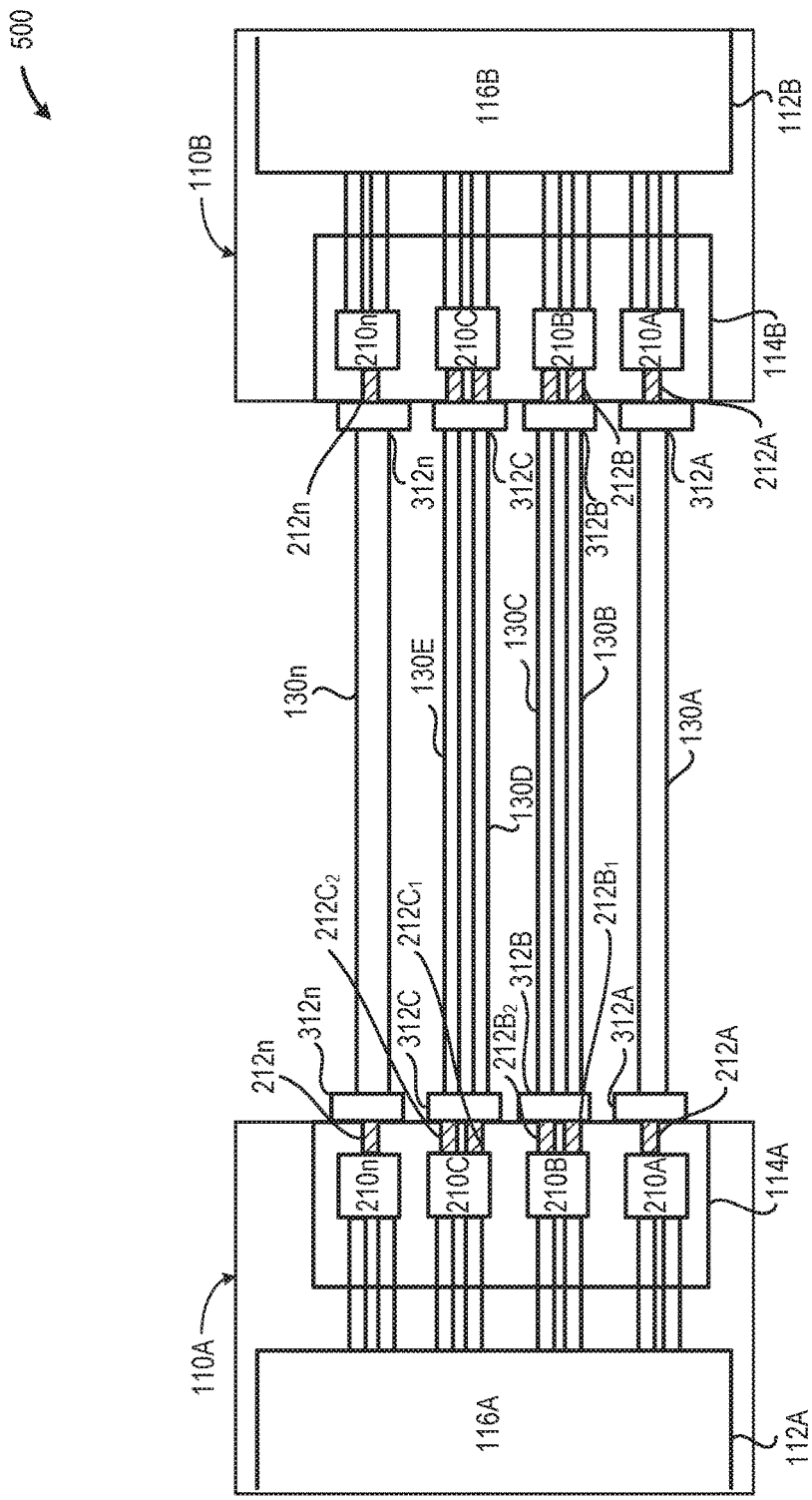
FIG. 5 is a schematic depicting an illustrative system that includes a plurality of waveguides communicably coupling a first semiconductor package having a plurality of RF-signal generators and RF-signal launchers with a second semiconductor package having a plurality of RF-signal generators and on-package RF-signal launchers, in accordance with at least one embodiment described herein.

FIG. 5 depicts an illustrative system 500 that includes a plurality of waveguides 130 communicably coupling a first semiconductor package 110A having a plurality of RF-signal generators 210 and RF-signal launchers 212 with a second semiconductor package 110B having a plurality of RF-signal generators 210 and on-package RF-signal launchers 212, in accordance with at least one embodiment described herein.

As depicted in FIG. 5, in some implementations, a plurality of RF-signal launchers 212 (e.g., $212B_1$ and $212B_2$) may be communicably coupled to a single RF-signal generator 210 (e.g., 210B). In such implementations, a single RF-signal generator 210 may communicate RF signals to a plurality of waveguides 130 (e.g., 130B and 130C). Such may occur, for example, when one or more high bandwidth requirement signals are generated by the logic circuit 116 and provided to the RF-signal generator 210. In such implementations, the attachment feature 312 may include one or more connector housings disposed about the plurality of waveguides 130 coupled to a single RF-signal launcher 212.

In some implementations, some or all of the plurality of RF-signal generators 210 may include mm-Wave dies disposed in, on, or about the semiconductor package 110. In some implementations, some or all of the plurality of RF-signal launchers 212 may include mm-Wave launchers disposed in, on, or about the semiconductor package 110. In such implementations, the system 500 may communicate one or more mm-Wave signals between the first semiconductor package 110A and the second semiconductor package 110B.

Figure 6:
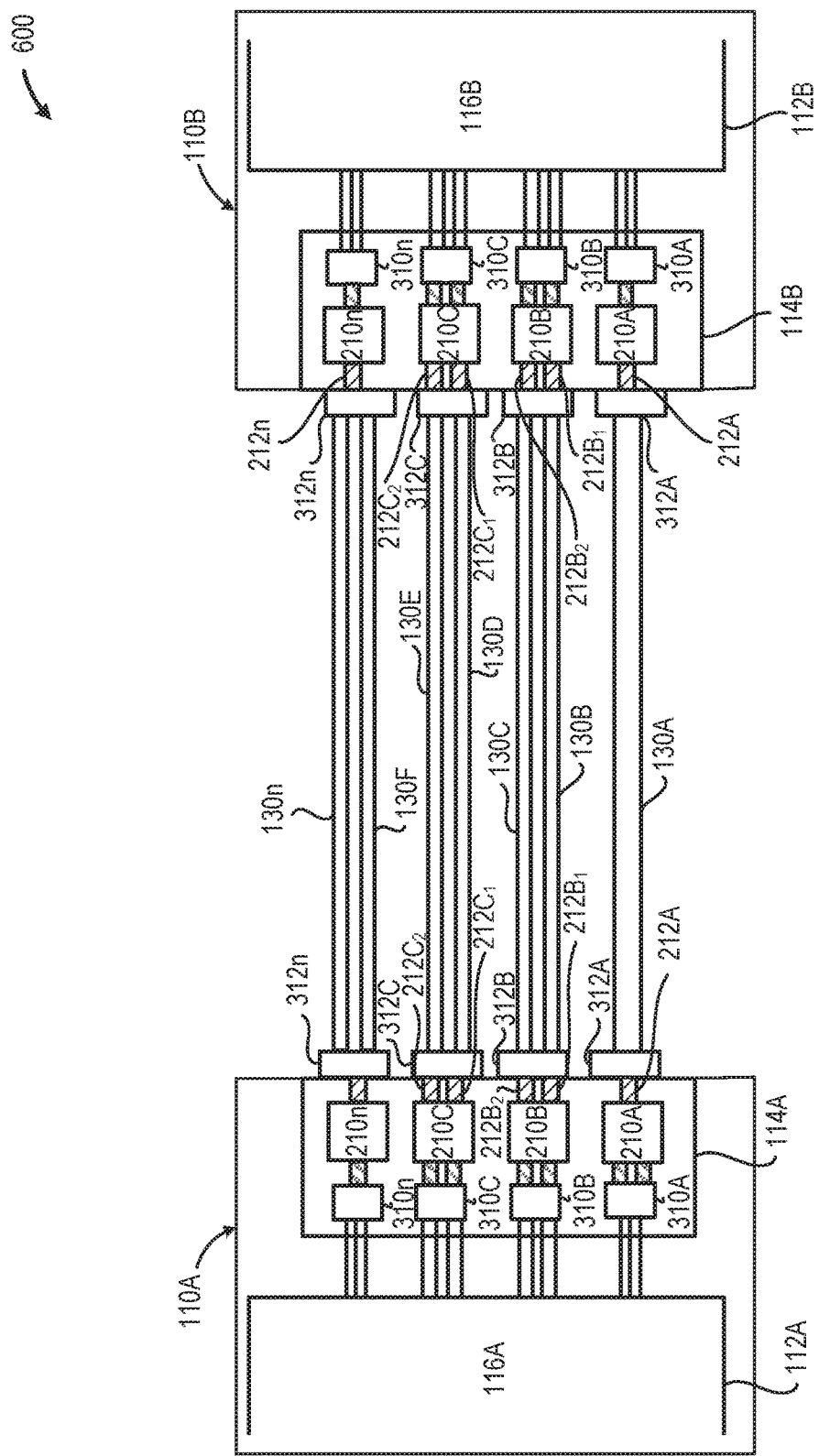
FIG. 6 is a schematic depicting an illustrative system that includes a plurality of waveguides communicably coupling a first semiconductor package having a plurality of serializers/deserializers, a plurality of RF-signal generators, and RF-signal launchers with a second semiconductor package having a plurality of serializers/deserializers, a plurality of RF-signal generators, and on-package RF-signal launchers, in accordance with at least one embodiment described herein.

FIG. 6 depicts an illustrative system 600 that includes a plurality of waveguides 130 communicably coupling a first semiconductor package 110A having a plurality of serializers/deserializers 310, a plurality of RF-signal generators 210, and RF-signal launchers 212 with a second semiconductor package 110B having a plurality of serializers/deserializers 310, a plurality of RF-signal generators 210, and on-package RF-signal launchers 212, in accordance with at least one embodiment described herein.

As depicted in FIG. 6, in some implementations, a plurality of RF-signal launchers 212 (e.g., $212B_1$ and $212B_2$) may be communicably coupled to a single RF-signal generator 210 (e.g., 210B). In such implementations, a single RF-signal generator 210 may communicate RF signals to a plurality of waveguides 130 (e.g., 130B and 130C). Such may occur, for example, when one or more high bandwidth requirement signals are generated by the logic circuit 116 and provided to the RF-signal generator 210. In such implementations, the attachment feature 312 may include one or more connector housings disposed about the plurality of waveguides 130 coupled to a single RF-signal launcher 212.

Figure 7:
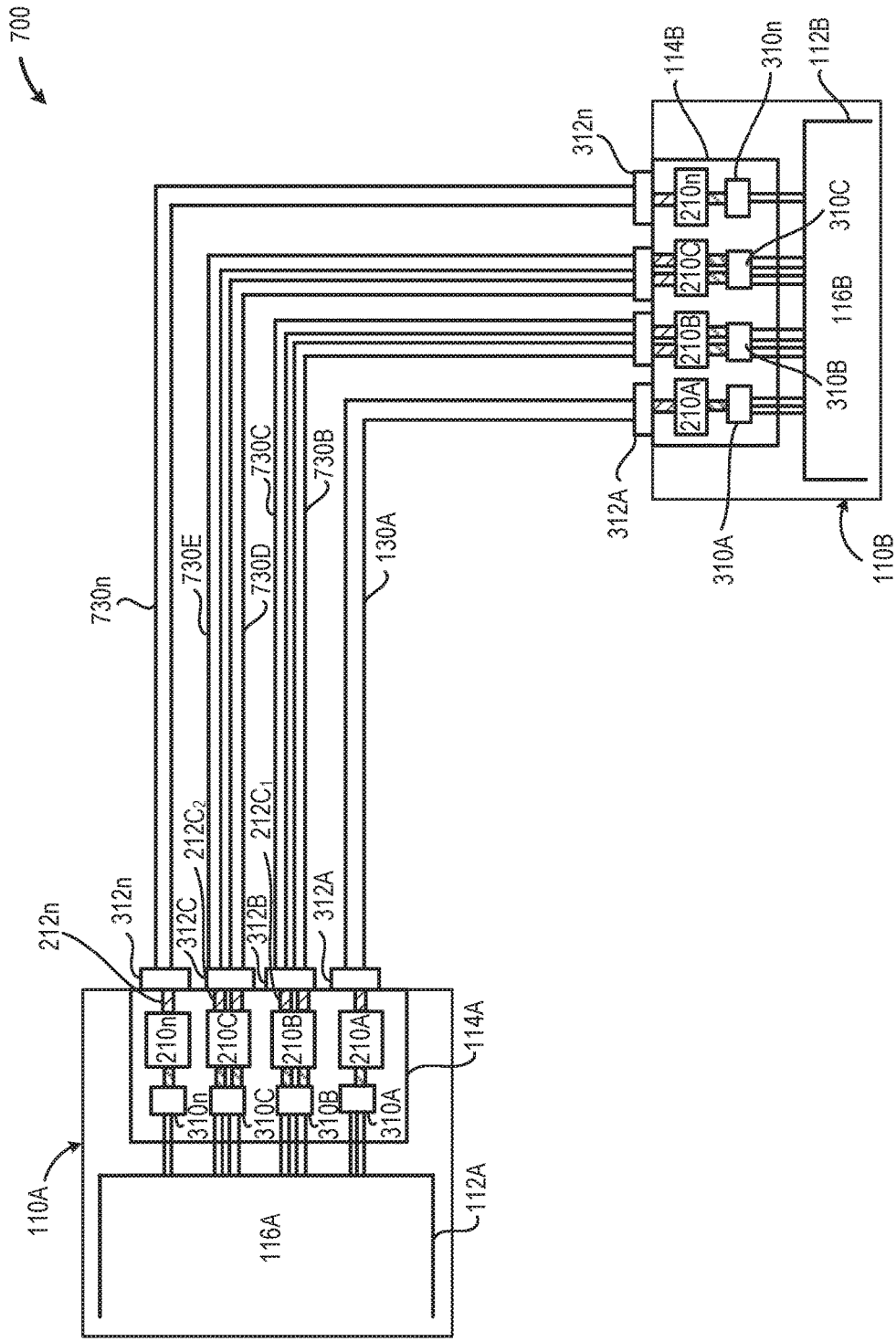
FIG. 7 is a schematic depicting an illustrative system that includes a plurality of waveguides communicably coupling a first semiconductor package having a plurality of serializers/deserializers, a plurality of RF-signal generators, and RF-signal launchers with a second semiconductor package having a plurality of serializers/deserializers, a plurality of RF-signal generators, and on-package RF-signal launchers, in accordance with at least one embodiment described herein.

FIG. 7 depicts an illustrative system 700 that includes a plurality of waveguides 130 communicably coupling a first semiconductor package 110A having a plurality of serializers/deserializers 310, a plurality of RF-signal generators 210, and RF-signal launchers 212 with a second semiconductor package 110B having a plurality of serializers/deserializers 310, a plurality of RF-signal generators 210, and on-package RF-signal launchers 212, in accordance with at least one embodiment described herein. As depicted in FIG. 7, in some implementations, the waveguides 730A-730n (collectively, "waveguides 730") may include any number of flexible or bendable waveguides 730. In at least some implementations, the waveguides 730 may be of different lengths. For example, in FIG. 7, waveguide 730A has a shorter length than waveguide 730n.

Figure 8:
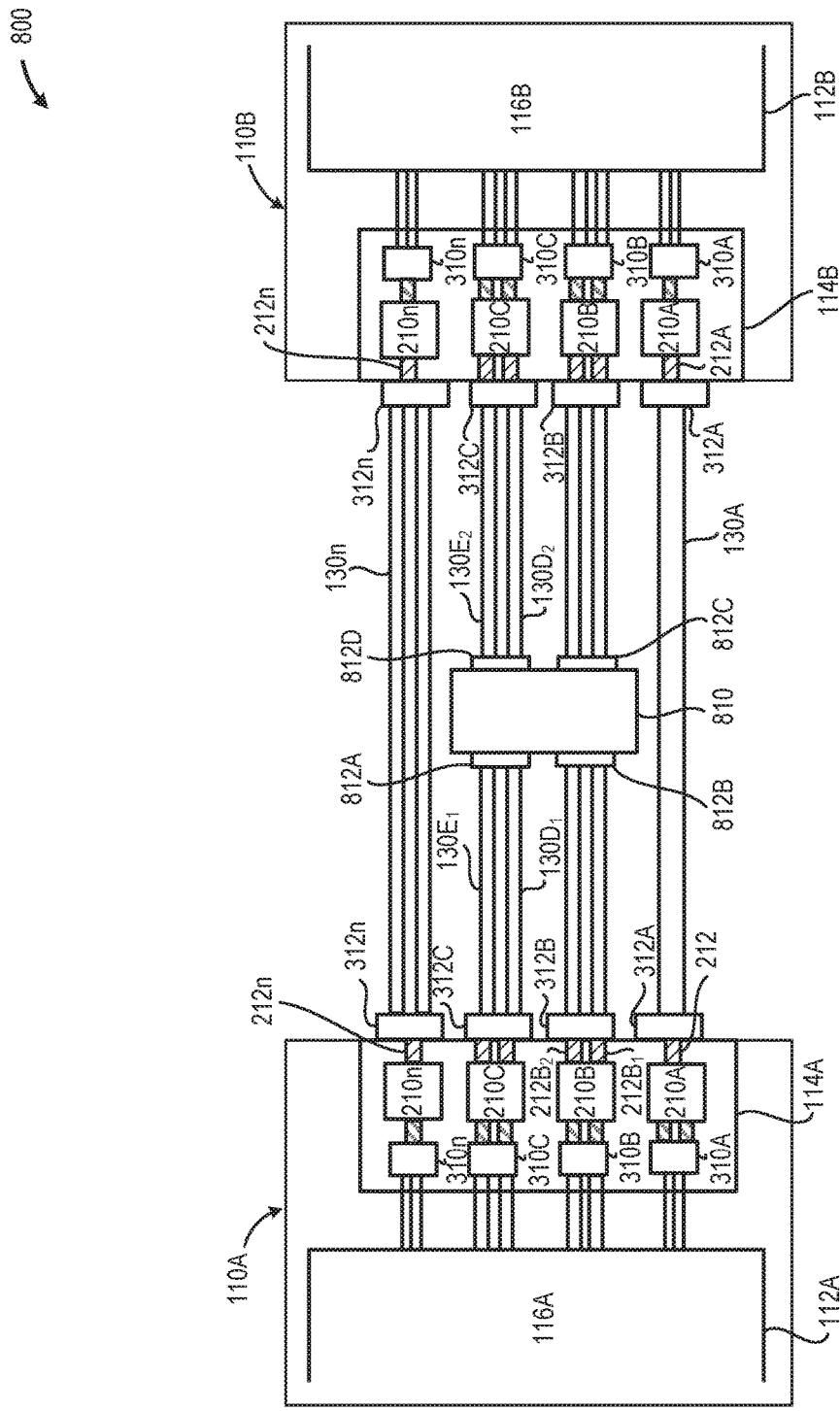
FIG. 8 is a schematic depicting an illustrative system that includes a plurality of waveguides, including a waveguide connector, communicably coupling a first semiconductor package having a plurality of serializers/deserializers, a plurality of RF-signal generators, and RF-signal launchers with a second semiconductor package having a plurality of serializers/deserializers, a plurality of RF-signal generators, and on-package RF-signal launchers, in accordance with at least one embodiment described herein.

FIG. 8 depicts an illustrative system 800 that includes a plurality of waveguides 130, including a waveguide connector 810, communicably coupling a first semiconductor package 110A having a plurality of serializers/deserializers 310, a plurality of RF-signal generators 210, and RF-signal launchers 212 with a second semiconductor package 110B having a plurality of serializers/deserializers 310, a plurality of RF-signal generators 210, and on-package RF-signal launchers 212, in accordance with at least one embodiment described herein. As depicted in FIG. 8, in some implementations, one or more waveguides 130 may include multiple sections (e.g., $130D_1$, $130D_2$ and $130E_1$, $130E_2$) that are communicably and operably coupled via one or more waveguide connectors 810.

In embodiments, the waveguide connector 810 may simply transmit the RF signal from a first waveguide segment (e.g., $130D_1$) to a second waveguide segment (e.g., $130D_2$). In some embodiments, the waveguide connector 810 may include one or more active or passive components. For example, the waveguide connector 810 may include one or more amplifiers, RF engines, or similar components to improve or enhance the signal strength of an RF signal passing through the waveguide connector 810 from a first waveguide segment $130E_1$ to a second waveguide segment $130E_2$. In another example, the waveguide connector 810 may include one or more active or passive filters or similar devices to improve the quality and/or reduce the noise present in an RF signal passing through the waveguide connector 810 from a first waveguide segment $130E_1$ to a second waveguide segment $130E_2$.

In some implementations, the waveguide connector 810 may include one or more attachment features 812A-812D (collectively "waveguide connector attachment features 812"). The waveguide connector attachment features 812 may include any number and/or combination of devices and/or systems capable of operably and communicably coupling the waveguide segments to the waveguide connector 810. In some implementations, the waveguide connector attachment features 812 permit the detachable attachment of the waveguide segments 130 to the waveguide connector 810. In some implementations, the waveguide connector attachment features 812 cause the permanent operable and communicable coupling of the waveguide segments 130 to the waveguide connector 810.

FIG. 9A depicts a cross-sectional view of an illustrative system 900A that includes a semiconductor package 110 having a logic circuit 116 coupled to a mm-Wave die 210 via a substrate trace 902, two mm-Wave launchers 212A, 212B, a bottom-mounted SERDES 310, a top-mounted waveguide connector 312 disposed proximate the mm-Wave launchers 212, and a plurality of waveguides 130 that are operably, physically, and communicably coupled to a substrate 910, in accordance with at least one embodiment described herein. FIG. 9B depicts a cross-sectional view of another illustrative system 900B that includes a semiconductor package 110 having a logic circuit 116 coupled to a mm-Wave die 210 via a substrate trace 902, two mm-Wave launchers 212A, 212B, a top-mounted SERDES 310, a bottom-mounted waveguide connector 312 disposed proximate the mm-Wave launchers 212, and a plurality of waveguides 130 that are operably, physically, and communicably coupled to a substrate 910, in accordance with at least one embodiment described herein. FIG. 9C depicts a cross-sectional view of another illustrative system 900C that includes a semiconductor package 110 having a logic circuit 116 coupled to a mm-Wave die 210 via a flex connector 904, two mm-Wave launchers 212A, 212B, a top-mounted SERDES 310, a bottom-mounted waveguide connector 312 disposed proximate the mm-Wave launchers 212, and a plurality of waveguides 130 that are operably, physically, and communicably coupled to a substrate 910, in accordance with at least one embodiment described herein.

A depicted in FIGS. 9A-9C, the logic circuit 116, mm-Wave die 210, mm-Wave Launchers 212 and waveguide connector 312 may be disposed within a common semiconductor package 110. In some implementations, the logic circuit 116 may pass any number and/or combination of low frequency signals to the mm-Wave die where the signal frequency is upconverted to a mm-Wave frequency RF signal that may be communicated to one or more remote semiconductor packages 110 via the waveguides 130. In some implementations, the waveguide connector 312 may be disposed between the mm-Wave die 210 and the substrate 910, such as depicted in FIGS. 9B and 9C. In other implementations, the waveguide connector 312 may be disposed proximate the mm-Wave die 210 on a side of the mm-Wave die opposite the substrate 910, such as depicted in FIG. 9A. In some implementations, the logic circuit 116 may be communicably coupled to the mm-Wave die 210 via one or more traces or similar conductive paths formed in the substrate 910, such as depicted in FIGS. 9A and 9B. In other implementations, the logic circuit 116 may be communicably coupled to the mm-Wave die 210 via one or more flexible traces, wires, or similar conductors 904, such as depicted in FIG. 9C.

Figure 10:
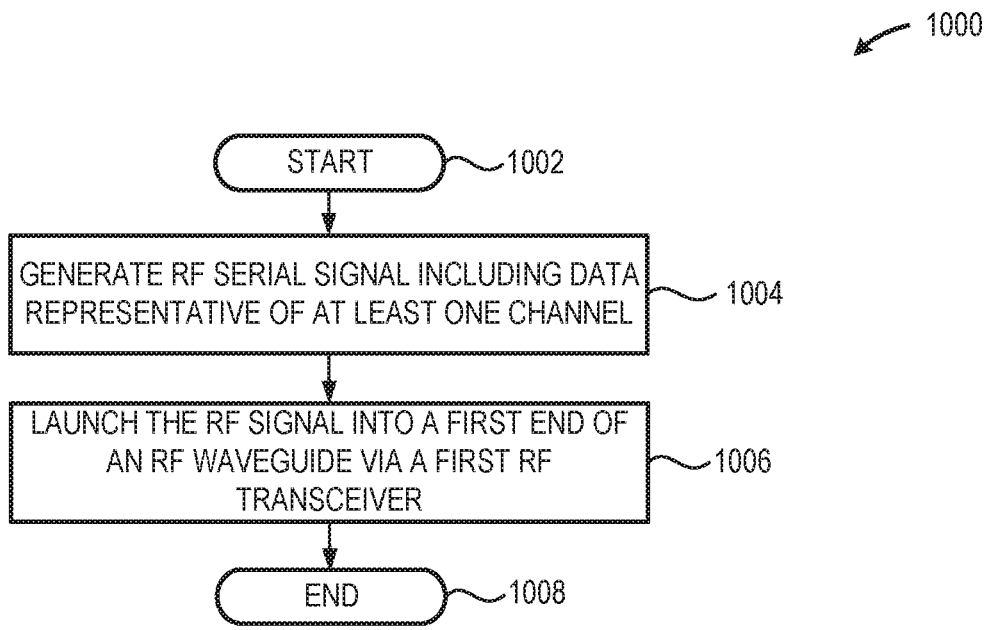
FIG. 10 is a high-level logic flow diagram of an illustrative method of communicating information and/or data using a semiconductor package that includes a logic circuit communicably coupled to a high-frequency RF transceiver capable of launching high-frequency RF waves into a communicably and operably coupled RF waveguide, in accordance with at least one embodiment described herein.

FIG. 10 is a high-level logic flow diagram of an illustrative method 1000 of communicating information and/or data using a semiconductor package 110 that includes a logic circuit 116 communicably coupled to a high-frequency RF-transceiver 114 capable of launching high-frequency RF waves into a communicably and operably coupled RF waveguide 130, in accordance with at least one embodiment described herein. The method 1000 commences at 1002.

At 1004, the logic circuit 116 generates at least one signal that is transmitted via one or more conductors 118 to the RF-transceiver 114. The RF-transceiver 114 upconverts the signal to a high-frequency signal for transmission to one or more recipient semiconductor packages 110 via one or more RF waveguides 130. In some implementations, the logic circuit 116 may include a number of such devices, each capable of communicating a low-frequency signal to the RF-transceiver 114 via one or more conductors 118 such that the RF-transceiver 114 receives a plurality of parallel, low-frequency, signals. In some implementations, the logic circuit 116 may generate a number of parallel, low-frequency, signals for communication to the RF-transceiver 114.

The logic circuit 116 may include any number and/or combination of systems and/or devices capable of generating an analog or digital output signal. In some implementations, the logic circuit 116 may include one or more communications interfaces, bus interfaces, or combinations thereof. In some implementations, the logic circuit 116 may include one or more processors, microprocessors, controllers, digital signal processors, or similar that are capable of providing one or more output signals to the RF-transceiver 114. In some implementations, the signals provided to the RF-transceiver may be clocked using a common timekeeper or similar clocking device to maintain synchronization.

At 1006, the RF-transceiver 114 receives the signal(s) from the logic circuit 116. In some implementations, the RF-transceiver 114 may receive a single signal from the logic circuit 116. In some implementations, the RF-transceiver 114 may receive a plurality of synchronized, low-frequency, parallel signals from the logic circuit 116. In some implementations, the RF-transceiver 114 may receive a plurality of non-synchronized, low-frequency, parallel signals from one or more logic circuit 116. In implementations where the RF-transceiver 114 receives a plurality of signals from the logic circuit 116, the RF-transceiver 114 serializes the plurality of signals to provide a single, low-frequency, serialized signal that includes information and/or data from each of the signals received from the logic circuit 116.

In implementations, the RF-transceiver 114 upconverts the low-frequency, serialized, signals to a higher frequency, RF signal for transmission to a destination semiconductor package 110 via one or more RF waveguides 130. The RF-transceiver 114 may include one or more RF-launch structures disposed in, on, about, or proximate the RF waveguide 130 to efficiently launch the RF signal into the RF waveguide with minimal energy loss and/or scattering. In some implementations, the RF signal may have a frequency of from about 3 kHz to about 300 GHz. In some implementations, the RF signal may have a frequency in the mm-Wave range, from 30 GHz to 300 GHz. The method 1000 concludes at 1008.

Figure 11:
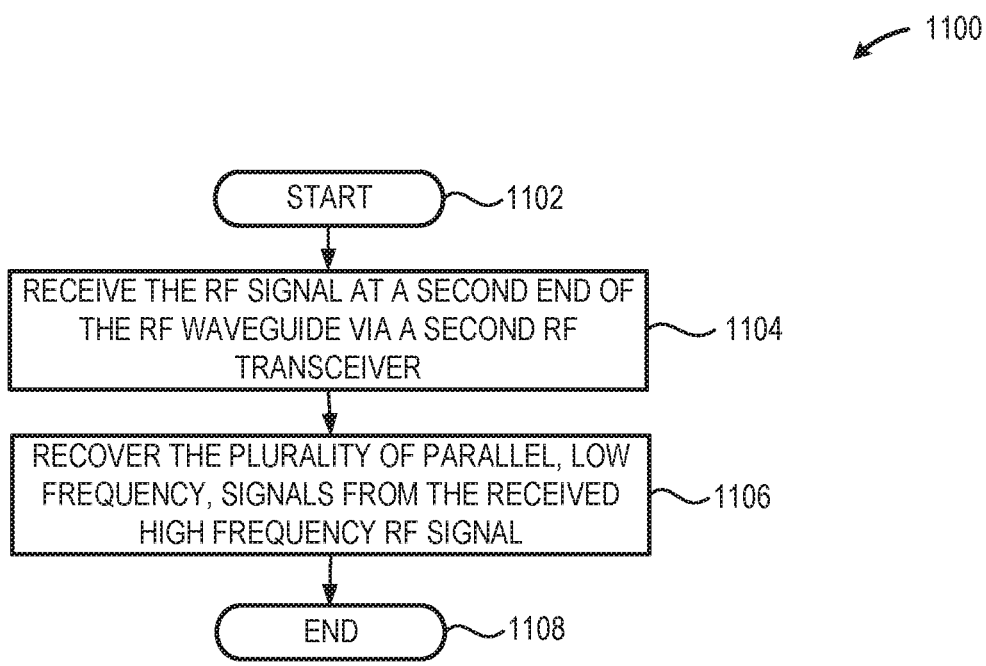
FIG. 11 is a high-level logic flow diagram of an illustrative method of receiving information and/or data using a semiconductor package that includes a logic circuit communicably coupled to a high-frequency RF transceiver capable of receiving high-frequency RF waves from a communicably and operably coupled RF waveguide, in accordance with at least one embodiment described herein.

FIG. 11 is a high-level logic flow diagram of an illustrative method 1100 of receiving information and/or data using a semiconductor package 110 that includes a logic circuit 116 communicably coupled to a high-frequency RF-transceiver 114 capable of receiving high-frequency RF waves from a communicably and operably coupled RF waveguide 130, in accordance with at least one embodiment described herein. The method 1100 may, in some implementations, be performed contemporaneous or simultaneous with the method 1000 described with regard to FIG. 10, above. The method 1100 commences at 1102.

At 1104, the RF-transceiver 114 operably and communicably coupled to a second semiconductor package 110B receives the signal(s) from the RF waveguide 130. In at least one implementation, the received RF signal may be communicated or otherwise transmitted or launched into the waveguide 130 by one or more other, remote, semiconductor packages 110. In some implementations, the received RF signal may include a plurality of multiplexed RF signals. In other implementations, the received RF signal may include a single RF signal.

At 1106, the RF-transceiver 114 recovers one or more low-frequency signals from the high-frequency RF signal received from the RF waveguide 130. In some implementations, only a single low-frequency signal is recovered from the high-frequency RF signal received from the RF waveguide 130. In other implementations, a plurality of low-frequency signals may be recovered from the high-frequency RF signal received from the RF waveguide 130. The RF-transceiver 114 may downconvert the high-frequency signal received from the RF-waveguide to a low-frequency signal. The downconverted signal may be deserialized to provide a plurality of individual, low-frequency, parallel, signals to the logic circuit 116. The method 1100 concludes at 1108.

Figure 12:
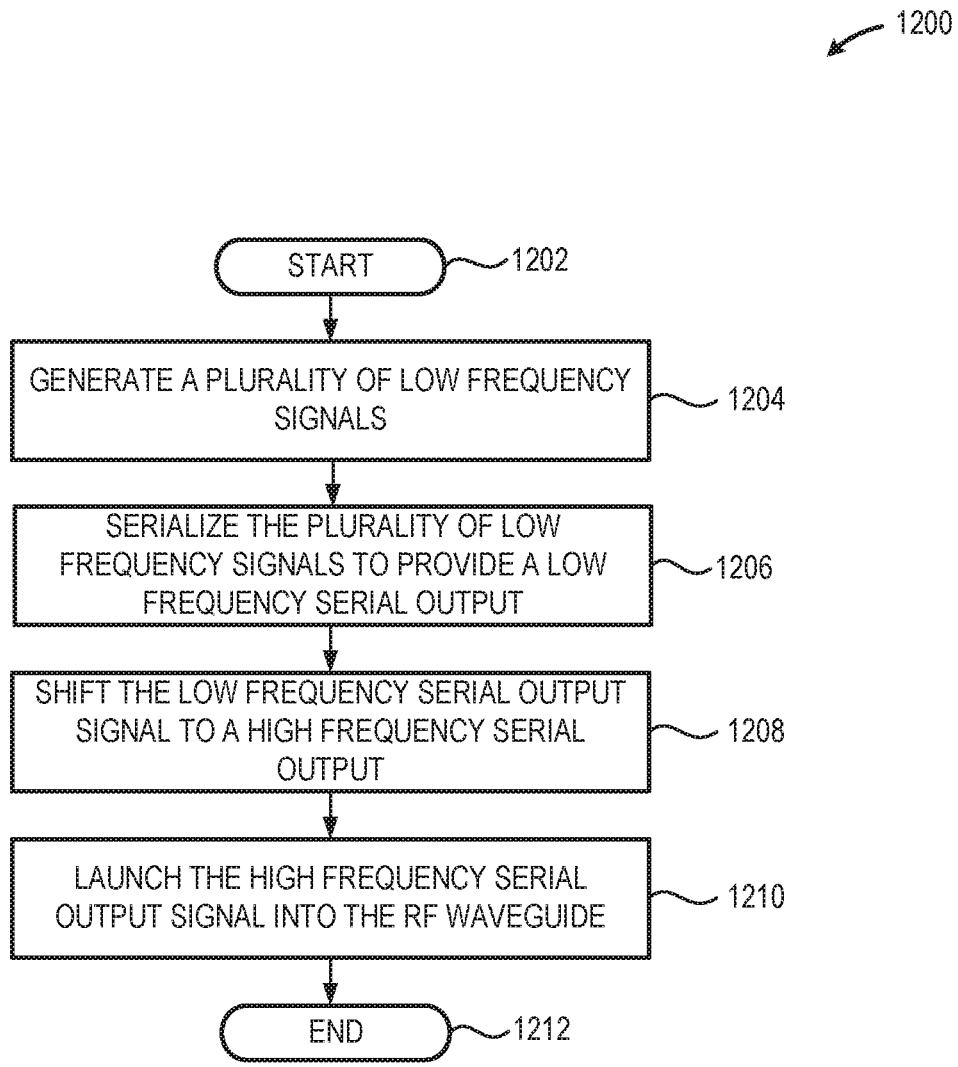
FIG. 12 is a high-level logic flow diagram of an illustrative method of communicating information and/or data using a semiconductor package that includes a serializer/deserializer (SERDES) to receive and serialize a plurality of low-frequency signals, a mm-Wave die to upconvert the SERDES output signal to a mm-Wave, and a mm-Wave launcher to launch the high-frequency (e.g., mm-Wave) output signal from the mm-Wave die into one or more RF waveguides, in accordance with at least one embodiment described herein.

FIG. 12 is a high-level logic flow diagram of an illustrative method 1200 of communicating information and/or data using a semiconductor package 110 that includes a serializer/deserializer (SERDES) 310 to receive and serialize a plurality of low-frequency signals, a mm-Wave die 210 to upconvert the SERDES output signal to a mm-Wave, and a mm-Wave launcher 212 to launch the high-frequency (e.g., mm-Wave) output signal from the mm-Wave die 210 into one or more RF waveguides 130, in accordance with at least one embodiment described herein. The method 1200 commences at 1202.

At 1204, one or more low-frequency signals are generated by one or more components, such as one or more signal generators or one or more logic circuits 116. In embodiments, the one or more signals may be generated by a first semiconductor package 110A located in a rack or similar enclosure. In such embodiments, the destination for some or all of the signals may include one or more semiconductor packages 110B located either in the same or a different rack.

At 1206, a serializer/deserializer (SERDES) 310 receives the one or more low frequency signals. The SERDES 310 serializes the received signals to produce a single, serialized, low-frequency, signal. In such implementations, the serialized, low-frequency, signal includes information and/or data from each of the one or more signals received by the SERDES 310.

At 1208, a mm-Wave die 210 receives the low-frequency, serialized, output signal from the SERDES 310. The mm-Wave die 210 upconverts the low-frequency signal to a high-frequency output signal. In some implementations, the mm-Wave die 210 generates a mm-Wave output signal having at a frequency of about 30 GHz to about 300 GHz using the serialized, output signal from the SERDES 310. The mm-Wave output signal from the mm-Wave die 210 includes information and/or data from each of the low frequency input signals provided to the SERDES 310.

At 1210, a mm-Wave launcher 212 receives the mm-Wave output signal produced by the mm-Wave die 210. The mm-Wave launcher 212 launches, communicates, or otherwise transmits the high-frequency mm-Wave signal into a communicably coupled RF waveguide 130. The RF waveguide directs the mm-Wave signal to one or more remote semiconductor package 110B. The method 1200 concludes at 1212.

Additionally, operations for the embodiments have been further described with reference to the above figures and accompanying examples. Some of the figures may include a logic flow. Although such figures presented herein may include a particular logic flow, it can be appreciated that the logic flow merely provides an example of how the general functionality described herein can be implemented. Further, the given logic flow does not necessarily have to be executed in the order presented unless otherwise indicated. The embodiments are not limited to this context.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. Thus, the breadth and scope of the present invention should not be limited by any of the above-described exemplary embodiments, but should be defined only in accordance with the following claims and their equivalents.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

According to example 1, there is provided a radio frequency communication system between semiconductor packages. The system may include an RF waveguide having a first end and a second end, a first semiconductor package that includes a first RF transceiver communicably coupled to the first end of the RF waveguide, and a second semiconductor package that includes a second RF transceiver communicably coupled to the second end of the RF waveguide to provide a bidirectional RF communication pathway between the first semiconductor package and the second semiconductor package, the second semiconductor package disposed remote from the first semiconductor package.

Example 2 may include elements of example 1 where the first RF transceiver includes a first RF signal producing die communicably coupled to a first RF-signal launcher; where the first RF signal producing die bi-directionally converts a low frequency signal to a high frequency RF signal; and where the first RF-signal launcher communicably couples to the first end of the RF waveguide and to the RF signal producing die.

Example 3 may include elements of example 2 where the first RF signal producing die comprises a first mm-Wave die to produce a high frequency mm-Wave RF signal; and where the first RF-signal launcher comprises a first mm-Wave signal launcher to launch the high frequency mm-Wave signal into the first end of the RF waveguide.

Example 4 may include elements of example 3 where the first mm-Wave signal launcher comprises a mm-Wave signal launcher disposed in, on, or about the first semiconductor package.

Example 5 may include elements of example 3 where the first mm-Wave signal launcher comprises a mm-Wave signal launcher disposed at least partially within the first end of the RF waveguide.

Example 6 may include elements of example 3 where the first mm-Wave signal launcher comprises a mm-Wave signal launcher disposed remote from the semiconductor package; and where one or more electrically conductive elements conductively couple the first mm-Wave signal launcher to the first mm-Wave die.

Example 7 may include elements of example 2 where the second RF transceiver includes a second RF signal producing die communicably coupled to a second RF-signal launcher; where the second RF signal producing die reversibly converts a low frequency serial signal to a mm-Wave frequency RF signal; and where the second RF-signal launcher is communicably coupled to the second end of the RF waveguide.

Example 8 may include elements of example 7 where the second RF signal producing die comprises a second mm-Wave die; and where the second RF-signal launcher comprises a second mm-Wave signal launcher.

Example 9 may include elements of example 7 where the second mm-Wave signal launcher may include a mm-Wave signal launcher disposed in, on, or about the second semiconductor package.

Example 10 may include elements of example 7 where the second mm-Wave signal launcher comprises a mm-Wave signal launcher disposed at least partially within the second end of the RF waveguide.

Example 11 may include elements of example 7 where the second mm-Wave signal launcher may include a mm-Wave signal launcher disposed remote from the second semiconductor package; and one or more electrically conductive elements conductively coupling the second mm-Wave signal launcher to the second mm-Wave die.

Example 12 may include elements of example 7, and the system may additionally include a first serializer/deserializer (SERDES) communicably coupled to the first semiconductor package and to the first RF signal producing die; and a second serializer/deserializer (SERDES) communicably coupled to the second semiconductor package and to the second RF signal producing die.

Example 13 may include elements of example 12, and the system may additionally include at least one first RF waveguide attachment feature disposed in, on, or about the first RF-signal launcher, the at least one first RF waveguide attachment feature to physically couple the RF waveguide to the first RF-signal launcher; and at least one second RF waveguide attachment feature disposed in, on, or about the second RF-signal launcher, the at least one second RF waveguide attachment feature to physically couple the RF waveguide to the second RF-signal launcher.

According to example 14, there is provided a method of communicating at least one radio frequency (RF) signal between a first semiconductor package and a second semiconductor package via an RF waveguide, the method may include generating, by the first semiconductor package, a high frequency RF signal using a plurality of parallel, low frequency, signals, each of the plurality of low frequency signals including data representative of at least one channel; and launching the high frequency RF signal into a first end of an RF waveguide via a first RF transceiver communicably coupled to the first semiconductor package.

Example 15 may include elements of example 14, and the method may additionally include receiving the high frequency RF signal at a second end of the RF waveguide via a second RF transceiver communicably coupled to the second semiconductor package, the second semiconductor package disposed remote from the first semiconductor package; and recovering the plurality of parallel, low frequency, signals from the received high frequency RF signal.

Example 16 may include elements of example 15 where receiving the high frequency RF signal at a second end of the RF waveguide via a second RF transceiver may include receiving the high frequency RF signal at a second end of the RF waveguide via a second RF transceiver communicably coupled to the second semiconductor package, the second semiconductor package disposed remote from the first semiconductor package and in a common rack-mount enclosure with the first semiconductor package.

Example 17 may include elements of example 14 where generating a high frequency RF signal using a plurality of parallel, low frequency, signals may include converting, by a first serializer/deserializer (SERDES), the plurality of parallel, low frequency, signals to a low frequency serial signal; and converting, by a first RF signal producing die, the low frequency serial signal to the high frequency RF signal that includes data representative of each of the plurality of parallel, low frequency, signals.

Example 18 may include elements of example 17 where launching the high frequency RF signal into a first end of an RF waveguide may include receiving, at a first RF-signal launcher communicably coupled between the first RF signal producing die and the first end of the RF waveguide, the high frequency RF signal; and launching the high frequency RF signal into the first end of the RF waveguide by the first RF-signal launcher.

Example 19 may include elements of example 18 where launching the high frequency RF signal into a first end of an RF waveguide may include launching the high frequency RF signal into the first end of the RF waveguide using a mm-Wave signal launcher disposed in, on, or about the first semiconductor package.

Example 20 may include elements of example 18 where launching the high frequency RF signal into a first end of an RF waveguide may include launching the high frequency RF signal into the first end of the RF waveguide using a mm-Wave signal launcher disposed at least partially within the first end of the RF waveguide.

Example 21 may include elements of example 18 where launching the high frequency RF signal into a first end of an RF waveguide may include launching the high frequency RF signal into the first end of the RF waveguide using a first mm-Wave signal launcher disposed remote from the first semiconductor package, wherein one or more electrically conductive elements conductively couple the first mm-Wave signal launcher to a first mm-Wave die.

Example 22 may include elements of example 15 where receiving the high frequency RF signal at a second end of the RF waveguide may include converting, by a second RF signal producing die, the high frequency RF signal that includes data representative of each of the plurality of parallel, low frequency, signals to the low frequency serial signal; and converting, by a second serializer/deserializer (SERDES), the frequency serial signal to the plurality of parallel, low frequency, signals.

Example 23 may include elements of example 22 where receiving the high frequency RF signal at the second end of the RF waveguide may include receiving, at a second RF-signal launcher communicably coupled between the second RF signal producing die and the second end of the RF waveguide, the high frequency RF signal.

Example 24 may include elements of example 23 where receiving the high frequency RF signal at the second end of the RF waveguide may include receiving the high frequency RF signal at the second end of the RF waveguide using a second mm-Wave signal launcher disposed in, on, or about the second semiconductor package.

Example 25 may include elements of example 23 where receiving the high frequency RF signal at the second end of the RF waveguide may include receiving the high frequency RF signal at the second end of the RF waveguide using a second mm-Wave signal launcher disposed at least partially within the second end of the RF waveguide.

Example 26 may include elements of example 23 where receiving the high frequency RF signal at the second end of the RF waveguide may include receiving the high frequency RF signal at the second end of the RF waveguide using a second mm-Wave signal launcher disposed remote from the second semiconductor package, wherein one or more electrically conductive elements conductively couple the second mm-Wave signal launcher to a second mm-Wave die.

According to example 27, there is provided a rack-mountable semiconductor package directly communicably coupleable to a radio frequency (RF) waveguide, the semiconductor package may include a plurality of low frequency signal generators disposed in, on, or about the rack-mountable semiconductor package; a serializer/deserializer (SERDES) disposed communicably coupled to each of the plurality of low frequency signal generators to generate a low frequency serial output that includes a data contribution from each of at least some of the plurality of low frequency signal generators; a mm-wave die communicably coupled to the SERDES, the mm-Wave die to receive the low frequency serial output and provide a high frequency serial output; and a mm-Wave launcher communicably coupled to the mm-Wave die and communicably coupleable to an RF waveguide, the mm-Wave launcher to receive the high frequency serial output signal and launch the high frequency serial output signal into the RF waveguide.

Example 28 may include elements of example 27 where the mm-Wave launcher is disposed in the rack-mountable semiconductor package; and the rack-mountable semiconductor package is communicably coupleable to the RF waveguide.

Example 29 may include elements of example 27, and the system may additionally include at least one RF waveguide connection feature to communicably couple an RF waveguide to the rack-mountable semiconductor package proximate the mm-Wave launcher.

Example 30 may include elements of example 27 where the plurality of low frequency signal generators and the SERDES are disposed in, on, or about the rack-mountable semiconductor package.

Example 31 may include elements of example 30 where the mm-Wave die is disposed in, on, or about the rack-mountable semiconductor package.

Example 32 may include elements of example 31 where the mm-Wave launcher is disposed in, on, or about the rack-mountable semiconductor package.

Example 33 may include elements of example 30 where the mm-Wave die is disposed on a mm-Wave substrate remote from the rack-mountable semiconductor package and one or more conductors communicably couple the mm-Wave die to the semiconductor package.

Example 34 may include elements of example 33 where the mm-Wave launcher is disposed on the mm-Wave substrate remote from the rack-mountable semiconductor package and one or more conductors communicably couple the mm-Wave die to the semiconductor package.

According to example 35, there is provided a method of launching at least one radio frequency (RF) signal into an RF waveguide. The method may include generating, by a rack-mountable semiconductor package, a plurality of low frequency signals; serializing, using a serializer/deserializer (SERDES) communicably coupled to the semiconductor package, the plurality of low frequency signals to provide a low frequency serial output that includes a data contribution from each of at least some of the plurality of low frequency signals; shifting the low frequency serial output signal to a high frequency serial output signal using a mm-Wave die communicably coupled to the SERDES; and launching the high frequency serial output signal into the RF waveguide.

Example 36 may include elements of example 35 where launching the high frequency serial output signal into the RF waveguide may include launching the high-frequency serial output signal using a mm-Wave launcher disposed in the rack-mountable semiconductor package.

Example 37 may include elements of example 35 where launching the high frequency serial output signal into the RF waveguide may include launching the high-frequency serial output signal into a mm-Wave launcher assembly disposed in, on, or about the rack-mountable semiconductor package and communicably coupleable to the RF waveguide.

Example 38 may include elements of example 35 where serializing the plurality of low frequency signals may include serializing the plurality of low frequency signals using a SERDES disposed in, on, or about the rack-mountable semiconductor package.

Example 39 may include elements of example 35 where shifting the low frequency serial output signal to a high frequency serial output signal may include shifting the low frequency serial output signal to a high frequency serial output signal using a mm-Wave die disposed in, on, or about the rack-mountable semiconductor package.

Example 40 may include elements of example 35 where shifting the low frequency serial output signal to a high frequency serial output signal may include communicably coupling a mm-Wave die on a mm-Wave substrate disposed remote from the semiconductor substrate via one or more electrical conductors; and shifting the low frequency serial output signal to a high frequency serial output signal using the mm-Wave die.

According to example 41, there is provided a system for launching at least one radio frequency (RF) signal into an RF waveguide. The system may include a means for generating a plurality of low frequency signals; a means for serializing the plurality of low frequency signals to provide a low frequency serial output that includes a data contribution from each of at least some of the plurality of low frequency signals; a means for shifting the low frequency serial output signal to a high frequency serial output signal; and a means for launching the high frequency serial output signal into the RF waveguide.

Example 42 may include elements of example 41 where the means for launching the high frequency serial output signal into the RF waveguide may include a means for launching the high-frequency serial output signal disposed in the rack-mountable semiconductor package.

Example 43 may include elements of example 41 where the means for serializing the plurality of low frequency signals may include a means for serializing the plurality of low frequency signals disposed in, on, or about the rack-mountable semiconductor package.

Example 44 may include elements of example 41 where the means for shifting the low frequency serial output signal to a high frequency serial output signal may include a means for shifting the low frequency serial output signal to a high frequency serial output signal disposed in, on, or about the rack-mountable semiconductor package.

According to example 45, there is provided a system for communicating at least one radio frequency (RF) signal between a first semiconductor package and a second semiconductor package via an RF waveguide. The system may include a means for generating a high frequency RF signal using a plurality of parallel, low frequency, signals, each of the plurality of low frequency signals including data representative of at least one channel; and a means for launching the high frequency RF signal into a first end of an RF waveguide via a first RF transceiver communicably coupled to the first semiconductor package.

Example 46 may include elements of example 45, and the system may further include a means for receiving the high frequency RF signal at a second end of the RF waveguide communicably coupled to the second semiconductor package, the second semiconductor package disposed remote from the first semiconductor package; and a means for recovering the plurality of parallel, low frequency, signals from the received high frequency RF signal.

Example 47 may include elements of example 46 where the means for receiving the high frequency RF signal at a second end of the RF waveguide may further include a means for receiving the high frequency RF signal at a second end of the RF waveguide communicably coupled to the second semiconductor package, the second semiconductor package disposed remote from the first semiconductor package and in a common rack-mount enclosure with the first semiconductor package.

Example 48 may include elements of example 45 where the means for generating a high frequency RF signal using a plurality of parallel, low frequency, signals may include a means for converting the plurality of parallel, low frequency, signals to a low frequency serial signal; and a means for converting the low frequency serial signal to the high frequency RF signal that includes data representative of each of the plurality of parallel, low frequency, signals.

Example 49 may include elements of example 48 where the means for launching the high frequency RF signal into a first end of an RF waveguide may further include a means for launching the high frequency RF signal into the first end of the RF waveguide disposed in, on, or about the first semiconductor package.

Example 50 may include elements of example 48 where the means for launching the high frequency RF signal into a first end of an RF waveguide may include a means for launching the high frequency RF signal into the first end of the RF waveguide disposed at least partially within the first end of the RF waveguide.

Example 51 may include elements of example 48 where the means for launching the high frequency RF signal into a first end of an RF waveguide may include a means for launching the high frequency RF signal into the first end of the RF waveguide disposed remote from the first semiconductor package.

Example 52 may include elements of example 46 where the means for receiving the high frequency RF signal at a second end of the RF waveguide may include a means for converting the high frequency RF signal to the low frequency, serialized, signal; and a means for converting the low frequency, serialized, signal to the plurality of parallel, low frequency, signals.

Example 53 may include elements of example 46 where the means for receiving the high frequency RF signal at the second end of the RF waveguide may include a means for receiving the high frequency RF signal at the second end of the RF waveguide disposed in, on, or about the second semiconductor package.

Example 54 may include elements of example 46 where the means for receiving the high frequency RF signal at the second end of the RF waveguide may include a means for receiving the high frequency RF signal at the second end of the RF waveguide disposed at least partially within the second end of the RF waveguide.

Example 55 may include elements of example 46 where the means for receiving the high frequency RF signal at the second end of the RF waveguide may include a means for receiving the high frequency RF signal at the second end of the RF waveguide disposed remote from the second semiconductor package.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A radio frequency (RF) communication system between semiconductor package substrates, comprising:
   an RF waveguide having a first end and a second end, wherein the RF waveguide comprises a structure that is at least partially hollow;
   a first semiconductor package substrate that includes a first RF transceiver communicably coupled to the first end of the RF waveguide;
   wherein the first RF transceiver includes a first RF signal producing die having a top mounting face and a bottom mounting face; and
   a first serializer/deserializer (SERDES) communicably coupled to the first semiconductor package substrate and to the first RF signal producing die;
   wherein the first end of the RF waveguide and the first SERDES are disposed on opposite mounting faces of the first RF signal producing die; and
   a second semiconductor package substrate that includes a second RF transceiver communicably coupled to the second end of the RF waveguide to provide a RF communication pathway between one or more devices communicably coupled to the first semiconductor package substrate and one or more devices communicably coupled to the second semiconductor package substrate, the second semiconductor package substrate disposed remote from the first semiconductor package substrate.

2. The system of claim 1, wherein the first RF transceiver includes a first RF-signal launcher communicably coupled to the first RF signal producing die;
   wherein the first RF signal producing die bi-directionally converts a low frequency signal to a high frequency RF signal; and
   wherein the first RF-signal launcher communicably couples to the first end of the RF waveguide and to the RF signal producing die.

3. The system of claim 2:
   wherein the first RF signal producing die comprises a first millimeter wave (mm-Wave) die to produce a high frequency mm-Wave RF signal; and wherein the first RF-signal launcher comprises a first mm-Wave signal launcher to launch the high frequency mm-Wave signal into the first end of the RF waveguide.

4. The system of claim 3, wherein the first mm-Wave signal launcher comprises a mm-Wave signal launcher disposed in or on the first semiconductor package substrate.

5. The system of claim 3, wherein the first mm-Wave signal launcher comprises a mm-Wave signal launcher disposed at least partially within the first end of the RF waveguide.

6. The system of claim 3:
wherein the first mm-Wave signal launcher comprises a mm-Wave signal launcher disposed remote from the first semiconductor package; and
wherein one or more electrically conductive elements conductively couple the first mm-Wave signal launcher to the first mm-Wave die.

7. The system of claim 2, wherein the second RF transceiver includes a second RF signal producing die communicably coupled to a second RF-signal launcher;
wherein the second RF signal producing die reversibly converts a low frequency serial signal to a millimeter wave (mm-Wave) frequency RF signal; and
wherein the second RF-signal launcher is communicably coupled to the second end of the RF waveguide.

8. The system of claim 7:
wherein the second RF signal producing die comprises a second mm-Wave die; and
wherein the second RF-signal launcher comprises a second mm-Wave signal launcher.

9. The system of claim 7, wherein the second mm-Wave signal launcher comprises:
a mm-Wave signal launcher disposed in or on the second semiconductor package substrate.

10. The system of claim 7, wherein the second mm-Wave signal launcher comprises a mm-Wave signal launcher disposed at least partially within the second end of the RF waveguide.

11. The system of claim 7, wherein the second mm-Wave signal launcher comprises:
a mm-Wave signal launcher disposed remote from the second semiconductor package substrate; and
one or more electrically conductive elements conductively coupling the second mm-Wave signal launcher to the second mm-Wave die.

12. The system of claim 7, further comprising:
a second serializer/deserializer (SERDES) communicably coupled to the second semiconductor package substrate and to the second RF signal producing die.

13. The system of claim 12, further comprising:
at least one first RF waveguide attachment feature disposed in, on, or around the first RF-signal launcher, the at least one first RF waveguide attachment feature to physically couple the RF waveguide to the first RF-signal launcher; and
at least one second RF waveguide attachment feature disposed in or on the second RF-signal launcher, the at least one second RF waveguide attachment feature to physically couple the RF waveguide to the second RF-signal launcher.

14. The system of claim 1, wherein the RF waveguide structure is at least partially filled with a dielectric material.

15. A method of communicating at least one radio frequency (RF) signal between a first semiconductor package substrate and a second semiconductor package substrate via an RF waveguide having a first end and a second end, the method comprising:

generating, by a first RF transceiver communicably coupled to the first semiconductor package, a high frequency RF signal utilizing a plurality of parallel low frequency signals, each of the plurality of low frequency signals including data representative of at least one channel;
wherein a first serializer/deserializer (SERDES) communicatively coupled to the first semiconductor package substrate converts the plurality of parallel low frequency signals to a low frequency serial signal; and
wherein a first RF signal producing die having a top mounting face and a bottom mounting face converts the low frequency serial signal to the high frequency RF signal that includes data representative of each of the plurality of parallel low frequency signals; and
launching the high frequency RF signal into a first end of an RF waveguide via the first RF transceiver, the first end of the RF waveguide and the first serializer/deserializer (SERDES) disposed on opposite mounting faces of the first RF signal producing die, and the RF waveguide comprising a structure that is at least partially hollow.

16. The method of claim 15, further comprising:
receiving the high frequency RF signal at the second end of the RF waveguide via a second RF transceiver communicably coupled to the second semiconductor package substrate, the second semiconductor package substrate disposed remote from the first semiconductor package substrate; and
recovering the plurality of parallel low frequency signals from the received high frequency RF signal.

17. The method of claim 16, wherein receiving the high frequency RF signal at the second end of the RF waveguide via the second RF transceiver comprises:
receiving the high frequency RF signal at the second end of the RF waveguide via the second RF transceiver communicably coupled to the second semiconductor package, the second semiconductor package substrate disposed remote from the first semiconductor package substrate.

18. The method of claim 16, wherein receiving the high frequency RF signal at the second end of the RF waveguide comprises:
converting, by a second RF signal producing die, the high frequency RF signal that includes data representative of each of the plurality of parallel low frequency signals to the low frequency serial signal; and
converting, by a second serializer/deserializer (SERDES), the high frequency RF signal to the plurality of parallel low frequency signals.

19. The method of claim 18, wherein receiving the high frequency RF signal at the second end of the RF waveguide comprises:
receiving, at a second RF-signal launcher communicably coupled between the second RF signal producing die and the second end of the RF waveguide, the high frequency RF signal.

20. The method of claim 19, wherein receiving the high frequency RF signal at the second end of the RF waveguide comprises:
receiving the high frequency RF signal at the second end of the RF waveguide utilitzing a second millimeter wave (mm-Wave) signal launcher disposed in, on, or around the second semiconductor package substrate.

21. The method of claim 19, wherein receiving the high frequency RF signal at the second end of the RF waveguide comprises:

receiving the high frequency RF signal at the second end of the RF waveguide utilitzing a second millimeter wave (mm-Wave) signal launcher disposed at least partially within the second end of the RF waveguide.

22. The method of claim 19, wherein receiving the high frequency RF signal at the second end of the RF waveguide comprises:

receiving the high frequency RF signal at the second end of the RF waveguide utilitzing a second millimeter wave (mm-Wave) signal launcher disposed remote from the second semiconductor package substrate, wherein one or more electrically conductive elements conductively couple the second mm-Wave signal launcher to a second mm-Wave die.

23. The method of claim 15, wherein launching the high frequency RF signal into the first end of the RF waveguide comprises:

receiving, at a first RF-signal launcher communicably coupled between the first RF signal producing die and the first end of the RF waveguide, the high frequency RF signal; and launching the high frequency RF signal into the first end of the RF waveguide by the first RF-signal launcher.

24. The method of claim 23, wherein launching the high frequency RF signal into the first end of the RF waveguide comprises:

launching the high frequency RF signal into the first end of the RF waveguide utilitzing a mm-Wave signal launcher disposed in or on the first semiconductor package substrate.

25. The method of claim 23, wherein launching the high frequency RF signal into the first end of the RF waveguide comprises:

launching the high frequency RF signal into the first end of the RF waveguide utilitzing a millimeter wave (mm-Wave) signal launcher disposed at least partially within the first end of the RF waveguide.

26. The method of claim 23, wherein launching the high frequency RF signal into the first end of the RF waveguide comprises:

launching the high frequency RF signal into the first end of the RF waveguide utilitzing a first millimeter wave (mm-Wave) signal launcher disposed remote from the first semiconductor package substrate, wherein one or more electrically conductive elements conductively couple the first mm-Wave signal launcher to a first mm-Wave die.

27. The method of claim 15, wherein the RF waveguide structure is at least partially filled with a dielectric material.

28. A rack-mountable semiconductor package substrate directly communicably coupleable to a radio frequency (RF) waveguide structure, the semiconductor package substrate including:

a plurality of low frequency signal generators disposed in or on the rack-mountable semiconductor package substrate;

a serializer/deserializer (SERDES) communicably coupled to each of the plurality of low frequency signal generators to generate a low frequency serial output that includes a data contribution from each of at least some of the plurality of low frequency signal generators;

a millimeter wave (mm-Wave) die communicably coupled to the SERDES, the mm-Wave die to receive the low frequency serial output and provide a high frequency serial output, the mm-Wave die further having a top mounting face and a bottom mounting face;

wherein the SERDES and the RF waveguide structure are disposed on opposite mounting faces of the mm-Wave die;

a mm-Wave launcher communicably coupled to the mm-Wave die and communicably coupleable to an at least partially hollow RF waveguide structure, the mm-Wave launcher to receive the high frequency serial output signal and launch the high frequency serial output signal into the RF waveguide structure.

29. The rack-mountable semiconductor package substrate of claim 28, wherein the at least partially hollow RF waveguide structure is at least partially filled with a dielectric material.

* * * * *